(12) United States Patent
Yang et al.

(10) Patent No.: US 10,083,254 B2
(45) Date of Patent: Sep. 25, 2018

(54) METHOD AND SYSTEM FOR STABILIZING FORMULATION METHODS

(75) Inventors: Yahan Yang, Pearland, TX (US); Xiaohui Wu, Sugar Land, TX (US)

(73) Assignee: ExxonMobil Upstream Research Company, Spring, TX (US)

(*) Notice: Subject to any disclaimer, the term of this patent is extended or adjusted under 35 U.S.C. 154(b) by 755 days.

(21) Appl. No.: 13/701,419

(22) PCT Filed: Mar. 3, 2011

(86) PCT No.: PCT/US2011/026937
§ 371 (c)(1),
(2), (4) Date: Nov. 30, 2012

(87) PCT Pub. No.: WO2011/159372
PCT Pub. Date: Dec. 22, 2011

(65) Prior Publication Data
US 2013/0080128 A1  Mar. 28, 2013

Related U.S. Application Data

(60) Provisional application No. 61/355,001, filed on Jun. 15, 2010.

(51) Int. Cl.
G06G 7/48 (2006.01)
G06F 17/50 (2006.01)
G01V 11/00 (2006.01)

(52) U.S. Cl.
CPC .......... *G06F 17/5009* (2013.01); *G01V 11/00* (2013.01)

(58) Field of Classification Search
CPC .. G06F 17/5009; G06F 2217/16; G06F 17/11; G06F 17/13; G06F 17/16;
(Continued)

(56) References Cited

U.S. PATENT DOCUMENTS 5,844,564 A  12/1998 Bennis et al.
6,018,497 A  1/2000 Gunasekera
(Continued)

FOREIGN PATENT DOCUMENTS

WO  WO 2002/03262 A2  1/2002

OTHER PUBLICATIONS

US 7,246,661, 07/2007, Carlson (withdrawn)
(Continued)

*Primary Examiner* — Hugh Jones
(74) *Attorney, Agent, or Firm* — ExxonMobil Upstream Research Company—Law Department

(57) ABSTRACT

A method is presented for modeling reservoir properties. The method includes an auxiliary time-stepping procedure of the reservoir between an old time and a new time, and calculating a plurality of masses explicitly. A plurality of phase component densities is updated linearly from the plurality of masses. A plurality of saturation changes is calculated based on the plurality of masses. A plurality of phase flow rates is updated based on the plurality of saturation changes, a plurality of phase flow rates at the old time, and a plurality of saturation derivatives of the phase flow rates at the old time. A plurality of component flow rates may be calculated based on the updated plurality of phase component densities and the plurality of phase flow rates. The method also includes a formulation method based on the auxiliary time stepping procedure.

20 Claims, 16 Drawing Sheets

(58) Field of Classification Search
CPC .......... G01V 99/005; G01V 1/30; G01V 1/28;
G01V 1/282; G01V 1/36; G01V
2210/644; G01V 2210/665; E21B 43/00;
E21B 47/00; E21B 43/12
USPC ...................................................... 703/2, 10
See application file for complete search history.

(56) References Cited

U.S. PATENT DOCUMENTS

| | | |
|---|---|---|
| 6,052,520 A | 4/2000 | Watts, III |
| 6,078,869 A | 6/2000 | Gunasekera |
| 6,101,447 A | 8/2000 | Poe, Jr. |
| 6,106,561 A | 8/2000 | Farmer |
| 6,230,101 B1 | 5/2001 | Wallis |
| 6,585,044 B2 | 7/2003 | Rester et al. |
| 6,662,146 B1 | 12/2003 | Watts |
| 6,985,841 B2 | 1/2006 | Barroux |
| 7,225,078 B2 | 5/2007 | Shelley et al. |
| 7,249,009 B2 | 7/2007 | Ferworn et al. |
| 7,363,206 B2 | 4/2008 | Jones et al. |
| 7,451,066 B2 | 11/2008 | Edwards et al. |
| 7,526,953 B2 | 5/2009 | Goodwin et al. |
| 7,561,997 B1 | 7/2009 | Miller |
| 7,505,365 B2 | 10/2009 | Chen et al. |
| 7,603,265 B2 | 10/2009 | Mainguy et al. |
| 7,634,395 B2 | 12/2009 | Flandrin et al. |
| 7,657,494 B2 | 2/2010 | Wilkinson et al. |
| 7,660,673 B2 | 2/2010 | Dozier |
| 7,739,089 B2 | 6/2010 | Gurpinar et al. |
| 7,809,537 B2 | 10/2010 | Hemanthkumar et al. |
| 7,809,538 B2 | 10/2010 | Thomas |
| 7,822,554 B2 | 10/2010 | Zuo et al. |
| RE42,245 E | 3/2011 | Thomas et al. |
| 7,920,970 B2 | 4/2011 | Zuo et al. |
| 7,932,904 B2 | 4/2011 | Branets et al. |
| 7,983,883 B2 | 7/2011 | Chen et al. |
| 8,078,437 B2 | 12/2011 | Wu et al. |
| 8,117,019 B2 | 2/2012 | Sun et al. |
| 8,175,751 B2 | 5/2012 | Thakur et al. |
| 8,212,814 B2 | 7/2012 | Branets et al. |
| 8,412,502 B2 * | 4/2013 | Moncorge et al. ............ 703/10 |
| 8,494,828 B2 | 7/2013 | Wu et al. |
| 8,776,895 B2 | 7/2014 | Li et al. |
| 8,818,780 B2 | 8/2014 | Calvert et al. |
| 8,825,461 B2 | 9/2014 | Sun et al. |
| 9,058,445 B2 | 6/2015 | Usadi et al. |
| 9,187,984 B2 | 11/2015 | Usadi et al. |
| 9,372,943 B2 | 6/2016 | Li et al. |
| 2003/0216897 A1 | 11/2003 | Endres et al. |
| 2007/0112547 A1 | 5/2007 | Ghorayeb |
| 2008/0046223 A1 | 2/2008 | Noetinger et al. |
| 2008/0208539 A1 | 8/2008 | Lee et al. |
| 2009/0055141 A1 | 2/2009 | Moncorge et al. |
| 2009/0210174 A1 | 8/2009 | Stone et al. |
| 2009/0281776 A1 | 11/2009 | Cheng et al. |
| 2010/0132450 A1 | 6/2010 | Pomerantz et al. |
| 2010/0145667 A1 | 6/2010 | Niu et al. |
| 2011/0077922 A1 | 3/2011 | Moncorge |
| 2012/0158389 A1 | 6/2012 | Wu et al. |
| 2012/0215513 A1 | 8/2012 | Branets et al. |
| 2013/0080128 A1 | 3/2013 | Yang et al. |
| 2013/0096898 A1 | 4/2013 | Usadi et al. |
| 2013/0096899 A1 | 4/2013 | Usadi et al. |
| 2013/0096900 A1 | 4/2013 | Usadi et al. |
| 2013/0231907 A1 | 9/2013 | Yang et al. |
| 2013/0246031 A1 | 9/2013 | Wu et al. |
| 2014/0330547 A1 | 11/2014 | Calvert et al. |
| 2015/0293260 A1 | 10/2015 | Ghayour et al. |
| 2016/0035130 A1 | 2/2016 | Branets et al. |
| 2016/0124113 A1 | 5/2016 | Bi et al. |
| 2016/0124117 A1 | 5/2016 | Huang et al. |
| 2016/0125555 A1 | 5/2016 | Branets et al. |

OTHER PUBLICATIONS

Sarma "Efficient Closed-Loop Optimal Control of Petroleum Reservoir under Uncertainty", a Dissertation submitted to the Department of Petroleum Engineering, Stanfoer University, Sep. 2006, pp. 1-201, Copyright by Pallav Sarma, 2006.*
Watts et al. "A Compositional Formulation of the Pressure and Saturation Equations", SPE Reservoir Engineering, May 1986, pp. 243-252.*
Stone et al. "Analysis of gas-cap or dissolved-gas drive reservoirs", Trans. Soc. Pet. Eng. AIME, 222 (1961), pp. 92-104.*
Aavatsmark, I. (2002), "An Introduction to Multipoint Flux Approximation for Quadrilateral Grids," *Computational Geosciences* 6, pp. 405-432.
Arbogast, T. (2002), "Implementation of a Locally Conservative Numerical Subgrid Upscaling Scheme for Two-Phase Darcy Flow," *Computational Geosciences* 6, pp. 453-481.
Blair, P.M. et al. (1969), "Solution of Two-Phase Flow Problems Using Implicit Difference Equations," *Trans. SPE of AIME* 246, pp. 417-424.
Branco, C.M. et al. (1995), "A Semi-Implicit Formulation for Compositional Reservoir Simulation," SPE 27053, *SPE Advanced Technology Series* 4(1), pp. 171-177.
Cao, H. et al. (2002), "Performance of IMPSAT and IMPSAT-AIM Models in Compositional Simulation," SPE 77720, SPE Annual Tech. Conf. and Exh., 10 pgs.
Chen, Q. et al. (2007), "A New Multipoint Flux Approximation for Reservoir Simulation," SPE 106464, 2007 SPE Symposium on Reservoir Simulation, 9 pgs.
Chen, Z. et al. (1997), "Comparison of Various Formulations of Three-Phase Flow in Porous Media," *J. Comput. Phys.*, 132, pp. 362-373.
Coats, K.H. et al. (1974), "Three-Dimensional Simulation of Steamflooding,"*Trans. SPE of AIME* 257, pp. 573-592.
Coats, K.H. (1976), "Simulation of Steamflooding with Distillation and Solution Gas," *Soc. Petrol. Eng. J.* 16, pp. 235-247.
Coats, K.H. (1980), "An Equation of State Compositional Model," *SPE J.*, pp. 363-376.
Coats, K.H. (2000), "A Note on IMPES and Some IMPES-Based Simulation Models", *SPE J.* 5(3), pp. 245-251.
Coats, K.H. (2003), "IMPES Stability: Selection of Stable Timesteps", *SPE J.*, pp. 181-187.
Haukas, J. et al. (2007) "A Comparison of Two Different IMPSAT Models in Compostional Simulation", *SPE J.*, pp. 145-151.
Hoteit, H. et al. (2006), "Compositional Modeling by the Combined Discontinuous Galerkin and Mixed Methods," *SPE J.*, pp. 19-34.
Lax, P.D. et al. (1960), "Systems of Conservation Laws," *Comm. Pure Appl. Math.* 13, pp. 217-237.
Lax, P.D. et al. (1964), "Difference Schemes for Hyperbolic Equations with High Order of Accuracy," *Comm. Pure Appl. Math.*, 17, pp. 381-398.
Lu, B., et al. (2007) "Iteratively Coupled Reservoir Simulation for Multiphase Flow"*SPE 110114, SPE Annual Technical Conference and Exhibition*, pp. 1-9.
Lu, P., et al. (2009), "Experience With Numerical Stability, Formulation and Parallel Efficiency of Adaptive Implicit Methods," *SPE 118977, SPE Symposium on Reservoir Simulation*, 10 pgs.
MacDonald, R.C. (1970), "Methods for Numerical Simulation of Water and Gas Coning," *Trans. SPE of AIME* 249, pp. 425-436.
Markovinovic, R. et al. (2006), "Accelerating Iterative Solution Methods Using Reduced-Order Models as Solution Predictors," *Int. J. Numer. Meth. Engng.* 68, pp. 525-541.
Mifflin, R.T. et al. (1991), "A Fully Coupled, Fully Implicit Reservoir Simulator for Thermal and Other Complex Reservoir Processes," *SPE 21252, 11th SPE Symposium on Reservoir Simulation*, pp. 457-470.
Peaceman, D. (1997), "Fundamentals of Numerical Reservoir Simulation—Chapter 6—Numerical Solution of Two-Phase Flow Problems," *Elsevier, Asterdam-Oxford-New York*, pp. 138-168.

(56) References Cited

OTHER PUBLICATIONS

Quandalle, P. et al. (1989), "An Implicit in Pressure and Saturations Approach to Fully Compositional Simulation," *SPE 18423, 10th SPE Symposium on Reservoir Simulation*, pp. 197-206.

Roe, P.L. (1981), "Approximate Riemann Solvers, Parameter Vectors, and Difference Schemes," *J. Comput. Phys.* 43, pp. 357-372.

Sheldon, J.W. et al. (1959), "One -dimensional Incompressible, Non-Capillary, Two-Phase Fluid Flow in a Porous Medium," *Trans. SPE of AIME* 216, pp. 290-296.

Spillette, A.G. et al. (1973), "A High-Stability Sequential Solution Approach to Reservoir Simulation," *SPE 4542, 48th Annual Fall Meeting*, 14 pgs.

Stone, H.L. et al. (1961), "Analysis of Gas-Cap or Dissolved-Gas Reservoirs," *Trans. SPE of AIME* 222, pp. 92-104.

Tchelepi, H.A. et al. (2005), "An Adaptive Multiphase Multiscale Finite Volume Simulator for Heterogeneous Reservoirs," *SPE 93395, 19th SPE Reservoir Simulation Symposium*, 10 pgs.

Thomas, G.W. et al. (1983), "Reservoir Simulation Using an Adaptive Implicit Method," *SPE J.*, pp. 959-968.

Trangenstein, J.A. et al. (1989), "Mathematical Structure of the Black-Oil Model for Petroleum Reservoir Simulation," *SIAM J. Applied Math.* 49, pp. 749-783.

Trangenstein, J.A. et al. (1989), "Mathematical Structure of Compositional Reservoir Simulation," *SIAM J. Sci. Stat. Comput.* 10, pp. 817-845.

Wan, J. et al. (2005), "General Stability Criteria for Compositional and Black-Oil Models," *SPE 93096, SPE Symposium on Reservoir Simulation*, 10 pgs.

Watts, J.W. (1986), "A Compositional Formulation of the Pressure and Saturation Equations," *SPE Reservoir Eng.*, pp. 243-252.

Wong, T.W. et al. (1987), "A Comparison of Two Approaches to Compositional and Black Oil Simulation," SPE 15999, 9th SPE Symposium on Reservoir Simulation, 15 pgs.

Young, L.C. (1993), "Implementation of an Adaptive Implicit Method," SPE 25245, 12th SPE Symposium on Reservoir Simulation, pp. 113-126.

\* cited by examiner

100

200

400

METHOD AND SYSTEM FOR STABILIZING FORMULATION METHODS

CROSS-REFERENCE TO RELATED APPLICATION

This application is a National Stage of International Application No. PCT/US11/26937 filed Mar. 3, 2011, which claims the benefit of Provisional Patent Application 61/355,001, filed Jun. 15, 2010 entitled METHOD AND SYSTEM FOR STABILIZING FORMULATION METHODS, the entireties of which are incorporated by reference herein.

FIELD OF INVENTION

Exemplary embodiments of the present techniques relate to a method and system for improving the stability and efficiency of computer simulations of multiphase flow.

BACKGROUND

This section is intended to introduce various aspects of the art, which may be associated with exemplary embodiments of the present techniques. This discussion is believed to assist in providing a framework to facilitate a better understanding of particular aspects of the present techniques. Accordingly, it should be understood that this section should be read in this light, and not necessarily as admissions of prior art.

Hydrocarbons are widely used for fuels and chemical feedstocks. Hydrocarbons are generally found in subsurface rock formations that can be termed "reservoirs." Removing hydrocarbons from the reservoirs depends on numerous physical properties of the rock formations, such as the permeability of the rock containing the hydrocarbons, the ability of the hydrocarbons to flow through the rock formations, and the proportion of hydrocarbons present, among others.

Often, mathematical models termed "simulation models" are used to simulate hydrocarbon reservoirs and optimize the production of the hydrocarbons. The goal of a simulation model is generally to simulate the flow patterns of the underlying geology in order to optimize the production of hydrocarbons from a set of wells and surface facilities.

The simulation model is a type of computational fluid dynamics simulation where a set of partial differential equations (PDE's) which govern multi-phase, multi-component fluid flow through porous media and the connected facility network is approximated and solved.

The set of governing differential equations vary with the physical process being modeled in the reservoir. They usually include volume balance, mass conservation, energy conservation, among others. The simulation is an iterative, time-stepping process where a particular hydrocarbon production strategy is optimized.

To perform fast and accurate reservoir simulation, discretization and formulation methods are of central importance because they deal with how mathematical equations governing multiphase flow are solved. Simulation models discretize the underlying PDEs on a structured (or unstructured) grid, which represents the reservoir rock, wells, and surface facility network. State variables, such as pressure and saturation, are defined at each grid block.

The discretization step casts the partial differential equations into discrete form suitable for computers to solve. The formulation method determines the overall solution procedure. The formulation method also determines how different equations and unknowns interact in the process. Unknowns may include unknown variables, such as pressure, saturation, component masses, etc.

Discretization methods include finite difference/finite volume, finite element, mixed finite element, discontinuous Galerkin, mimetic finite difference, etc. Today, two-point finite volume schemes are commonly used because they are easy to implement and fast to execute. However, two-point finite volume schemes have been found to compare unfavorably in terms of accuracy against multipoint finite volume methods or finite element type schemes. See Aavatsmark, I., "An Introduction to Multipoint Flux Approximation for Quadrilateral Grids," Computational Geosciences, 6, 405-432 (2002); see also Chen, Q., Wan, J., Yang, Y. and Mifflin, R., "A New Multipoint Flux Approximation for Reservoir Simulation," paper SPE 106464 presented at the 2007 SPE Symposium on Reservoir Simulation, The Woodlands, Tex., Feb. 26-27, 2007; see also Hoteit, H. and Firoozabadi, A., "Compositional Modeling by the Combined Discontinuous Galerkin and Mixed Methods," SPE J., 19-34. (2006); see also Coats, K. H., "A Note on IMPES and Some IMPES-Based Simulation Models," SPE J., 248 (2000).

Formulation methods include IMPES, Sequential Implicit (SI), IMPSAT, and Coupled Implicit (CI). All these methods have been used extensively in solving practical problems in simulation models.

The different formulation methods produce very different results in terms of stability, accuracy, and efficiency. With CI, all primary unknown variables which appear in the volume and mass conservation equations are solved implicitly. See Blair, P. M. and Weinaug, C. F., "Solution of Two-Phase Flow Problems Using Implicit Difference Equations," Trans. SPE of AIME, 246, 417-424 (1969); see also Coats, K. H., "An Equation of State Compositional Model," SPE J., 363-376 (1980). It is well-known that CI takes more time to solve for each time step, but produces stable simulation results even for large time step sizes.

Because of its stability, CI has been particularly effective in modeling challenging flow behaviors, for example, thermal process or water/gas coning near wells. See Mifflin, R. T. and Watts, J. W., "A Fully Coupled, Fully Implicit Reservoir Simulator for Thermal and Other Complex Reservoir Processes," paper SPE 21252 presented at the 11th SPE Symposium on Reservoir Simulation, Anaheim, Calif., Feb. 17-20, 1991. Unfortunately, the cost for solving a CI system increases rapidly with the number of unknowns, which makes the technique impractical for modeling large reservoirs, especially when compositional models are used.

IMPES is at another end of the spectrum from CI. See Sheldon, J. W., Zondek, B., and Cardwell, W. T., "One-dimensional Incompressible, Non-Capillary, Two-Phase Fluid Flow in a Porous Medium," Trans. SPE of AIME, 216, 290-296 (1959); see also Stone, H. L. and Garder, A. O. Jr., "Analysis of Gas-Cap or Dissolved-Gas Reservoirs," Trans. SPE of AIME, 222, 92-104 (1961). In terms of implicitness, with the IMPES method, pressure is the only unknown variable solved implicitly. Saturation and component masses are updated explicitly after the pressure solve.

IMPES has been known to be fast per time step but tends to produce unstable results. For reservoirs which exhibit complex phase behaviors or significant pressure or saturation changes, numerical instability associated with IMPES could force simulation to take very small time steps, or cause it to bog down altogether before reaching the simulation end time.

Sequential Implicit (SI) and IMPSAT have been used to reach a desirable balance between stability and efficiency and they lie between IMPES and CI in terms of cost and stability. See MacDonald, R. C. and Coats, K. H., "Methods for Numerical Simulation of Water and Gas Coning," Trans. SPE of AIME, 249, 425-43622 (1970); see also Spillette, A. G., Hillestad, J. G., and Stone, H. L., "A High-Stability Sequential Solution Approach to Reservoir Simulation," SPE 4542, 48th Annual Fall Meeting, Las Vegas, Sep. 30-Oct. 3, (1973); see also Watts, J. W., "A Compositional Formulation of the Pressure and Saturation Equations," SPE Reservoir Engineering, May, 243-252 (1986); see also Quandalle, P. and Savary, D., "An Implicit in Pressure and Saturations Approach to Fully Compositional Simulation," paper SPE 18423 presented at the 10th SPE Symposium on Reservoir Simulation, Houston, Tex., Feb. 6-8, 1989; see also Branco, C. M. and Rodriguez, F., "A Semi-Implicit Formulation for Compositional Reservoir Simulation," paper SPE 27053, SPE Advanced Technology Series, Vol. 4, No. 1, (1995); see also Cao, H. and Aziz K., "Performance of IMPSAT and IMPSAT-AIM Models in Compositional Simulation," paper SPE 77720 presented at the SPE Annual Technical Conference and Exhibition held in San Antonio, Tex., Sep. 29-Oct. 2, 2002. Though SI was originally proposed to work with finite difference/volume method for modeling flows in reservoirs, researchers have recently used it with new discretization methods, including mixed finite element, multiscale control volume method, among others. See Arbogast, T., "Implementation of a Locally Conservative Numerical Subgrid Upscaling Scheme for Two-Phase Darcy Flow, Computational Geosciences," 6, 453-481 (2002); see also Tchelepi, H. A., Jenny, P., Lee, S. H., and Wolfsteiner, C., "An Adaptive Multiphase Multiscale Finite Volume Simulator for Heterogeneous Reservoirs," SPE 93395 presented at the 19th SPE Reservoir Simulation Symposium, The Woodlands, Tex., Jan. 31-Feb. 2, 2005.

With SI, each simulation time step consists of two solves. The first solves pressure unknowns at explicit saturation values, similar to IMPES. After the pressure solve, total flow velocity is computed. Flow rates are then expressed in terms of saturation unknowns, which are solved in the second step.

Because SI solves only one or two unknowns for each reservoir block in one time step, the computational cost for SI is very modest compared to CI. This is especially true for simulations of compositional models.

With SI, stability is increased due to the saturation step (the second step). While stability for SI is an improvement over IMPES, SI is still not as stable as CI.

The increased stability allows sequential runs to move forward when encountering difficult flow behaviors which would have triggered severe oscillations for IMPES. For this reason SI has been a practical option for the industry.

As the industry faces increasingly challenging production environments, however, engineers are building more and more complex reservoir models. It has been observed that with difficult simulation models, numerical instability from SI could produce oscillations in results severe enough to mask the true trend of flow responses in the reservoir. This behavior could have many undesirable consequences, for example, it could generate misleading data on gas-oil ratio, water cut and other parameters necessary for engineers to make well management decisions.

As a possible alternative to SI, IMPSAT solves a similar set of equations but is even closer to CI in terms of implicitness. For each time step, IMPSAT treats pressure and saturations as unknown variables and solves them simultaneously. Because of this, IMPSAT is more expensive than SI, but improves stability in situations where pressure and saturation behaviors are tightly coupled.

In general, the stability in formulation methods such as IMPES, SI, IMPSAT, and CI improves as the implicitness of the formulation method increases. Unfortunately, with the increase in implicitness, the cost of deriving solutions rises dramatically.

One approach to combat the implicitness versus cost balance combines formulation methods. By combining formulation methods, the adaptive implicit method (AIM), aims to take advantage of the strengths and avoid the weakness of the different formulation methods. In AIM, a reservoir may be dynamically divided into different regions based on certain stability criteria. The different formulation methods may then be targeted to the different regions. However, formulating robust stability criteria and creating an adaptable, highly efficient computational infrastructure are challenging tasks for AIM. Still, AIM has shown promising results. See Thomas, G. W. and Thurnau, D. H., "Reservoir Simulation Using an Adaptive Implicit Method," SPE J, 959-968 (1983); see also Young, L. C., "Implementation of an Adaptive Implicit Method," paper SPE 25245 presented at the 12th SPE Symposium on Reservoir Simulation held in New Orleans, La., Feb. 28-Mar. 3, 1993; see also Wan, J., Sarma, P., Usadi, A. K., and Beckner, B. L., "General Stability Criteria for Compositional and Black-Oil Models," paper SPE 93096 presented at the SPE Symposium on Reservoir Simulation held in Houston, Tex., Jan. 31-Feb. 2, 2005; see also Lu, P., Shaw, J. S., Eccles, T. K., Mishev, I., and Beckner, B. L., "Experience With Numerical Stability, Formulation and Parallel Efficiency of Adaptive Implicit Methods," paper SPE 118977 presented at the SPE Symposium on Reservoir Simulation held in Houston, Tex., Feb. 2-4, 2009.

There have been a number of research articles published on the general subject of formulation methods and partial differential equations for transport flow modeling. See, for example, Chen, Z. and Ewing, R., "Comparison of Various Formulations of Three-Phase Flow in Porous Media," J. Comput. Phys., 1997, 132, 362-373; see also, Coats, K. H., George, W. D., and Marcum, B. E., "Three-Dimensional Simulation of Steamflooding," Trans. SPE of AIME, 1974, 257, 573-592; see also, Coats, K. H., "Simulation of Steamflooding with Distillation and Solution Gas," Soc. Petrol. Eng. J., 1976, 16, 235-247; see also Markovinovic, R. and Jansen, J. D., "Accelerating Iterative Solution Methods Using Reduced-Order Models as Solution Predictors," Int. J. Numer. Meth. Engng., 2006, 68, 525-541; see also Trangenstein, J. A. and Bell, J. B., "Mathematical Structure of the Black-Oil Model for Petroleum Reservoir Simulation," SIAM J. Applied Math., 1989, 49, 749-783; see also Trangenstein, J. A. and Bell, J. B., "Mathematical Structure of Compositional Reservoir Simulation," SIAM J. Sci. Stat. Comput., 1989, 10, 817-845; see also Wong, T. W., Firoozabadi, A., Nutakki, R., and Aziz, K., "A Comparison of Two Approaches to Compositional and Black Oil Simulation," paper SPE 15999 presented at the 9th SPE Symposium on Reservoir Simulation, San Antonio, Tex., Feb. 1-4, 1987; see also Peaceman, D., "Fundamentals of Numerical Reservoir Simulation," Elsevier, Amsterdam-Oxford-New York, 1977; see also Lax, P. D. and Wendroff, B., "Systems of Conservation Laws," Comm. Pure Appl. Math., 1960, 13, 217-237; see also Lax, P. D. and Wendroff, B., "Difference Schemes for Hyperbolic Equations with High Order of Accuracy," Comm. Pure Appl. Math., 1964, 17, 381-398; see also Roe, P. L., "Approximate Riemann Solvers, Parameter Vectors, and Difference Schemes," J. Comput. Phys., 1981, 43, 357-372.

There are numerous approaches to performing reservoir simulation. Some of them, pertinent to problems in the oil and gas industry are described in U.S. Pat. No. 6,662,146. The patent describes how to perform reservoir simulation by solving a mixed implicit-IMPES matrix equation.

There is an approach to predicting behavior of a subterranean formation, described in U.S. Pat. No. 6,052,520. The patent describes how to estimate saturations from linearized relative permeabilities and capillary pressures.

There is an approach to performing oilfield simulation operations, described in U.S. Patent Application Publication No. 2009/0055141. The publication describes how to determine a time-step for simulating a reservoir using a reservoir model, calculating a plurality of conditions of the reservoir model corresponding to the time-step, simulating a cell of the reservoir model using an IMPES system to obtain a first simulation result, using the reservoir model with a fully implicit method (FIM) system to obtain a second simulation result, and performing an oilfield operation based on the first and second simulation results.

There is an approach described for a new IMPSAT model in J. Haukas, I. Aavatsmark, and M. Espedal, U. of Bergen, and E. Reiso, "A Comparison of Two Different IMPSAT Models in Compositional Simulation," SPE J. 148-149 (2007). Isochoric variables are solved explicitly, and compared to a conventional IMPSAT model.

There is an approach for IMPES stability, described in K. H. Coats, "IMPES Stability: Selection of Stable Timesteps," SPE J., 5-6 (2003). Stability criterion are used to set time steps, or as a switching criterion in an adaptive implicit model.

There is an approach for reservoir simulation described in Lu, B. and Alshallan, T., "Iteratively Coupled Reservoir Simulation for Multiphase Flow," paper SPE 110114 presented at the SPE Annual Technical Conference and Exhibition, Anaheim, Calif., Nov. 11-14, 2007. Using the iterative approach allegedly reduces computational time by 30-40% over other approaches using the IMPES and fully implicit methods (FIM).

There is also an approach describing stability criteria in Wan, J. "General Stability Criteria for Compositional and Black-Oil Models," paper 93096-MS presented at the SPE Reservoir Simulation Symposium, The Woodlands, Tex., Jan. 31-Feb. 2, 2005. General stability criteria are derived with various levels of implicitness. The derived criteria may provide a reasonable measure in the most general models.

SUMMARY

A method is presented for modeling reservoir properties. The method includes an auxiliary time-stepping procedure of the reservoir between an old time and a new time, and calculating a plurality of masses explicitly. A plurality of phase component densities is updated linearly from the plurality of masses. A plurality of saturation changes is calculated based on the plurality of masses. A plurality of phase flow rates is updated based on the plurality of saturation changes, a plurality of phase flow rates at the old time, and a plurality of saturation derivatives of the phase flow rates at the old time. A plurality of component flow rates may be calculated based on the updated plurality of phase component densities and the updated plurality of phase flow rates. The method also includes an IMPSAT formulation method based on the auxiliary time-stepping procedure.

In some embodiments, one or more unknown variables of the formulation method are approximated at the time level between the old time and the new time. In other embodiments, the one or more unknown variables of the formulation method may be approximated at the new time.

Another exemplary embodiment of the present techniques provides a system for modeling properties of a reservoir. The system may include a plurality of processors, and a machine readable medium comprising code configured to direct at least one of the plurality of processors to solve a pressure equation for the reservoir based on a sequential implicit (SI) formulation method. A plurality of phase flow rates for the reservoir may be updated based on the solved pressure equation. A plurality of component flow rates for the reservoir may be updated based on the solved pressure equation. A plurality of phase flow rate derivatives for the reservoir may be calculated with respect to a plurality of saturations for the reservoir. A plurality of component flow rate derivatives for the reservoir may be calculated with respect to a plurality of saturations for the reservoir. An auxiliary time-stepping procedure is performed between an old time and a new time. A total phase flow rate is preserved. The auxiliary time-stepping procedure includes calculating a plurality of masses of the reservoir explicitly. A plurality of phase component densities of the reservoir is updated linearly from the plurality of masses. A plurality of saturation changes of the reservoir is calculated based on the plurality of masses. A plurality of phase flow rates of the reservoir is updated based on the plurality of saturation changes. A plurality of component flow rates of the reservoir is calculated based on the updated plurality of phase component densities and the plurality of phase flow rates. The SI formulation method may be performed based on the auxiliary time-stepping procedure.

In some embodiments, a discretization method associated with the IMPSAT formulation method is performed. The discretization method may be one of a finite difference, finite volume, finite element, mixed finite element, discontinuous Galerkin, and mimetic finite difference discretization method.

In some embodiments, one or more unknown variables of the formulation method may be approximated at a mid time level between the old time and the new time.

Another exemplary embodiment of the present techniques provides a method for producing hydrocarbons from an oil and/or gas field using a stabilized formulation method relating to a physical structure. The method for producing hydrocarbons includes performing an IMPES formulation method for the oil and/or gas field. A pressure equation may be solved for the oil and/or gas field based on the IMPES formulation method. A plurality of phase flow rates for the oil and/or gas field may be updated based on the solved pressure equation. A plurality of component flow rates for the oil and/or gas field may be updated based on the solved pressure equation. A plurality of phase flow rate derivatives for the oil and/or gas field may be calculated with respect to a plurality of saturations for the reservoir. A plurality of component flow rate derivatives for the oil and/or gas field may be calculated with respect to the plurality of saturations for the oil and/or gas field. An auxiliary time-stepping procedure between an old time and a new time may be performed, wherein a total phase flow rate is preserved. The auxiliary time-stepping procedure includes calculating a plurality of masses for the oil and/or gas field explicitly. A plurality of phase component densities for the oil and/or gas field may be updated linearly from the plurality of masses. A plurality of saturation changes for the oil and/or gas field may be calculated based on the plurality of masses. A plurality of phase flow rates for the oil and/or gas field may be updated based on the plurality of saturation changes. A plurality of component flow rates for the oil and/or gas field may be calculated based on the updated plurality of phase component densities and the plurality of phase flow rates.

In some embodiments, the formulation method may be based on one of a black-oil model, and a compositional model.

BRIEF DESCRIPTION OF THE DRAWINGS

The advantages of the present techniques are better understood by referring to the following detailed description and the attached drawings, in which.

DETAILED DESCRIPTION

Figure 1:
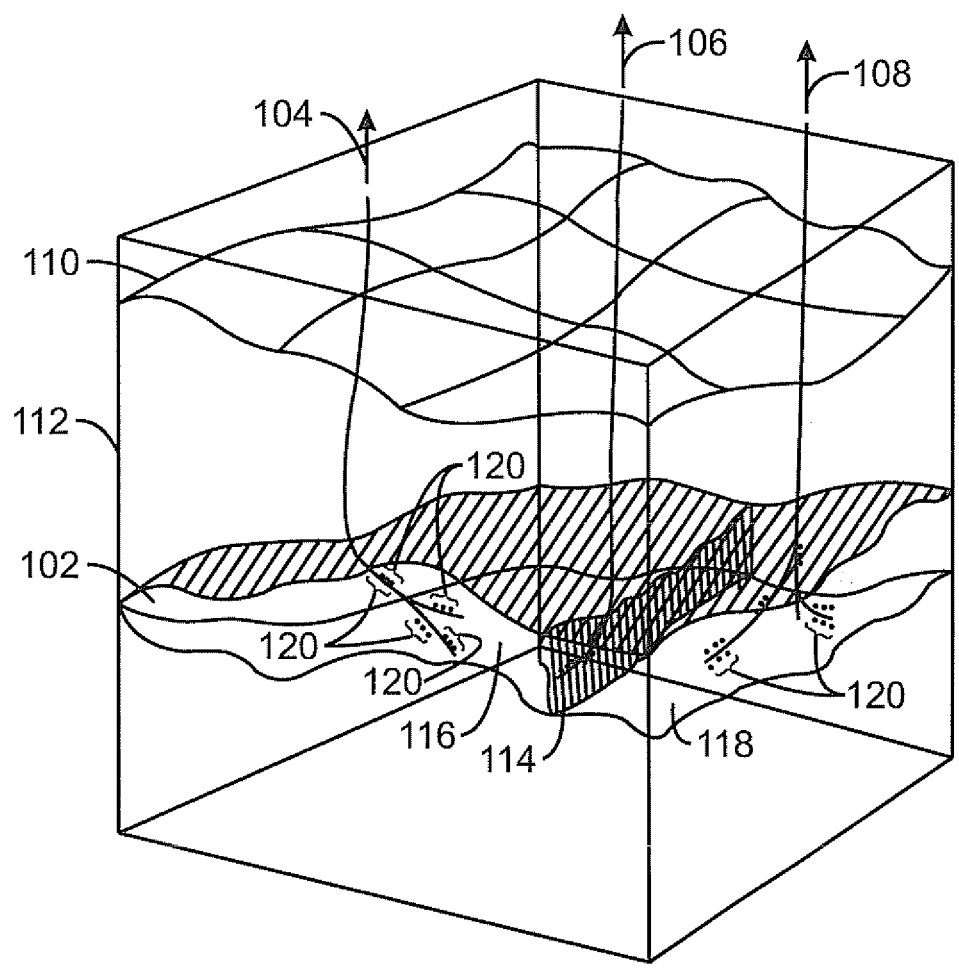
FIG. 1 is a schematic view of a reservoir, in accordance with an exemplary embodiment of the present techniques.

In the following detailed description section, the specific embodiments of the present techniques are described in connection with preferred embodiments. However, to the extent that the following description is specific to a particular embodiment or a particular use of the present techniques, this is intended to be for exemplary purposes only and simply provides a description of the exemplary embodiments. Accordingly, the present techniques are not limited to the specific embodiments described below, but rather, such techniques include all alternatives, modifications, and equivalents falling within the true spirit and scope of the appended claims.

At the outset, and for ease of reference, certain terms used in this application and their meanings as used in this context are set forth. To the extent a term used herein is not defined below, it should be given the broadest definition persons in the pertinent art have given that term as reflected in at least one printed publication or issued patent. Further, the present techniques are not limited by the usage of the terms shown below, as all equivalents, synonyms, new developments, and terms or techniques that serve the same or a similar purpose are considered to be within the scope of the present claims.

"Computer-readable medium" or "tangible, computer-readable medium" as used herein refers to any tangible storage and/or transmission medium that participates in providing instructions to a processor for execution. Such a medium may include, but is not limited to, non-volatile media and volatile media. Non-volatile media includes, for example, NVRAM, or magnetic or optical disks. Volatile media includes dynamic memory, such as main memory. Common forms of computer-readable media include, for example, a floppy disk, a flexible disk, a hard disk, an array of hard disks, a magnetic tape, or any other magnetic medium, magneto-optical medium, a CD-ROM, a holographic medium, any other optical medium, a RAM, a PROM, and EPROM, a FLASH-EPROM, a solid state medium like a memory card, any other memory chip or cartridge, or any other tangible medium from which a computer can read data or instructions. When the computer-readable media is configured as a database, it is to be understood that the database may be any type of database, such as relational, hierarchical, object-oriented, and/or the like.

As used herein, "to display" or "displaying" includes a direct act that causes displaying, as well as any indirect act that facilitates displaying. Indirect acts include providing software to an end user, maintaining a website through which a user is enabled to affect a display, hyperlinking to such a website, or cooperating or partnering with an entity who performs such direct or indirect acts. Thus, a first party may operate alone or in cooperation with a third party vendor to enable the reference signal to be generated on a display device. The display device may include any device suitable for displaying the reference image, such as without limitation a CRT monitor, a LCD monitor, a plasma device, a flat panel device, or printer. The display device may include a device which has been calibrated through the use of any conventional software intended to be used in evaluating, correcting, and/or improving display results (for example, a color monitor that has been adjusted using monitor calibration software). Rather than (or in addition to) displaying the reference image on a display device, a method, consistent with the present techniques, may include providing a reference image to a subject. "Providing a reference image" may include creating or distributing the reference image to the subject by physical, telephonic, or electronic delivery, providing access over a network to the reference, or creating or distributing software to the subject configured to run on the subject's workstation or computer including the reference image. In one example, the providing of the reference image could involve enabling the subject to obtain the reference image in hard copy form via a printer. For example, information, software, and/or instructions could be transmitted (for example, electronically or physically via a data storage device or hard copy) and/or otherwise made available (for example, via a network) in order to facilitate the subject using a printer to print a hard copy form of reference image. In such an example, the printer may be a printer which has been calibrated through the use of any conventional software intended to be used in evaluating, correcting, and/or improving printing results (for example, a color printer that has been adjusted using color correction software).

"Exemplary" is used exclusively herein to mean "serving as an example, instance, or illustration." Any embodiment described herein as "exemplary" is not to be construed as preferred or advantageous over other embodiments.

"Flow simulation" is defined as a numerical method of simulating pressure and the transport of mass (typically fluids, such as oil, water and gas), energy, and momentum through a physical system using a computer. The physical system includes a three dimensional reservoir model, fluid properties, the number and locations of wells. Flow simulations also require a strategy (often called a well-management strategy) for controlling injection and production rates. These strategies are typically used to maintain reservoir pressure by replacing produced fluids with injected fluids (for example, water and/or gas). When a flow simulation correctly recreates a past reservoir performance, it is said to be "history matched," and a higher degree of confidence is placed in its ability to predict the future fluid behavior in the reservoir.

"Permeability" is the capacity of a rock to transmit fluids through the interconnected pore spaces of the rock. Permeability may be measured using Darcy's Law: $Q=(k \Delta P A)/(\mu L)$, wherein $Q$=flow rate (cm3/s), $\Delta P$=pressure drop (atm) across a cylinder having a length L (cm) and a cross-sectional area A (cm2), $\mu$=fluid viscosity (cp), and k=permeability (Darcy). The customary unit of measurement for permeability is the millidarcy. The term "relatively permeable" is defined, with respect to formations or portions thereof, as an average permeability of 10 millidarcy or more (for example, 10 or 100 millidarcy). The term "relatively low permeability" is defined, with respect to formations or portions thereof, as an average permeability of less than about 10 millidarcy. An impermeable layer generally has a permeability of less than about 0.1 millidarcy.

"Porosity" is defined as the ratio of the volume of pore space to the total bulk volume of the material expressed in percent. Porosity is a measure of the reservoir rock's storage capacity for fluids. Porosity is preferably determined from cores, sonic logs, density logs, neutron logs or resistivity logs. Total or absolute porosity includes all the pore spaces, whereas effective porosity includes only the interconnected pores and corresponds to the pore volume available for depletion.

"Reservoir" or "reservoir formations" are typically pay zones (for example, hydrocarbon producing zones) that include sandstone, limestone, chalk, coal and some types of shale. Pay zones can vary in thickness from less than one foot (0.3048 m) to hundreds of feet (hundreds of m). The permeability of the reservoir formation provides the potential for production.

"Reservoir properties" and "reservoir property values" are defined as quantities representing physical attributes of rocks containing reservoir fluids. The term "reservoir properties" as used in this application includes both measurable and descriptive attributes. Examples of measurable reservoir property values include porosity, permeability, water saturation, and fracture density. Examples of descriptive reservoir property values include facies, lithology (for example, sandstone or carbonate), and environment-of-deposition (EOD). Reservoir properties may be populated into a reservoir framework to generate a reservoir model.

"Simulation model" refers to a specific mathematical representation of a real hydrocarbon reservoir, which may be considered to be a particular type of geologic model. Simulation models are used to conduct numerical experiments (reservoir simulations) regarding future performance of the field with the goal of determining the most profitable operating strategy. An engineer managing a hydrocarbon reservoir may create many different simulation models, possibly with varying degrees of complexity, in order to quantify the past performance of the reservoir and predict its future performance.

"Transmissibility" refers to the volumetric flow rate between two points at unit viscosity for a given pressure-drop. Transmissibility is a useful measure of connectivity. Transmissibility between any two compartments in a reservoir (fault blocks or geologic zones), or between the well and the reservoir (or particular geologic zones), or between injectors and producers, can all be useful for understanding connectivity in the reservoir.

"Well" or "wellbore" includes cased, cased and cemented, or open-hole wellbores, and may be any type of well, including, but not limited to, a producing well, an experimental well, an exploratory well, and the like. Wellbores may be vertical, horizontal, any angle between vertical and horizontal, deviated or non-deviated, and combinations thereof, for example a vertical well with a non-vertical component. Wellbores are typically drilled and then completed by positioning a casing string within the wellbore. Conventionally, the casing string is cemented to the well face by circulating cement into the annulus defined between the outer surface of the casing string and the wellbore face. The casing string, once embedded in cement within the well, is then perforated to allow fluid communication between the inside and outside of the tubulars across intervals of interest. The perforations allow for the flow of treating chemicals (or substances) from the inside of the casing string into the surrounding formations in order to stimulate the production or injection of fluids. Later, the perforations are used to receive the flow of hydrocarbons from the formations so that they may be delivered through the casing string to the surface, or to allow the continued injection of fluids for reservoir management or disposal purposes.

Overview

Exemplary embodiments of the present techniques relate to methods and systems for improving the stability of formulation methods for simulation models. The techniques may improve stability without greatly increasing the computational cost. In an exemplary embodiment, the techniques improve the stability of IMPES, SI, and IMPSAT formulation methods.

FIG. 1 is a schematic view 100 of a reservoir 102, in accordance with an exemplary embodiment of the present techniques. The reservoir 102, such as an oil or natural gas reservoir, can be a subsurface formation that may be accessed by drilling wells 104, 106, and 108 from the surface 110 through layers of overburden 112. The reservoir 102 may have one or more faults 114 dividing areas, for example regions 116 and 118, and which may either restrict or enhance the flow of hydrocarbons. The wells 104, 106, and 108 may be deviated, such as being directionally drilled to follow the reservoir 102. Further, the wells can be branched to increase the amount of hydrocarbon that may be drained from the reservoir, as shown for wells 104 and 108. The wells 104, 106, and 108, can have numerous areas with perforations 120 (indicated as dots next to the wells) to allow hydrocarbons to flow from the reservoir 102 into the wells 104, 106, and 108 for removal to the surface.

Figure 2:
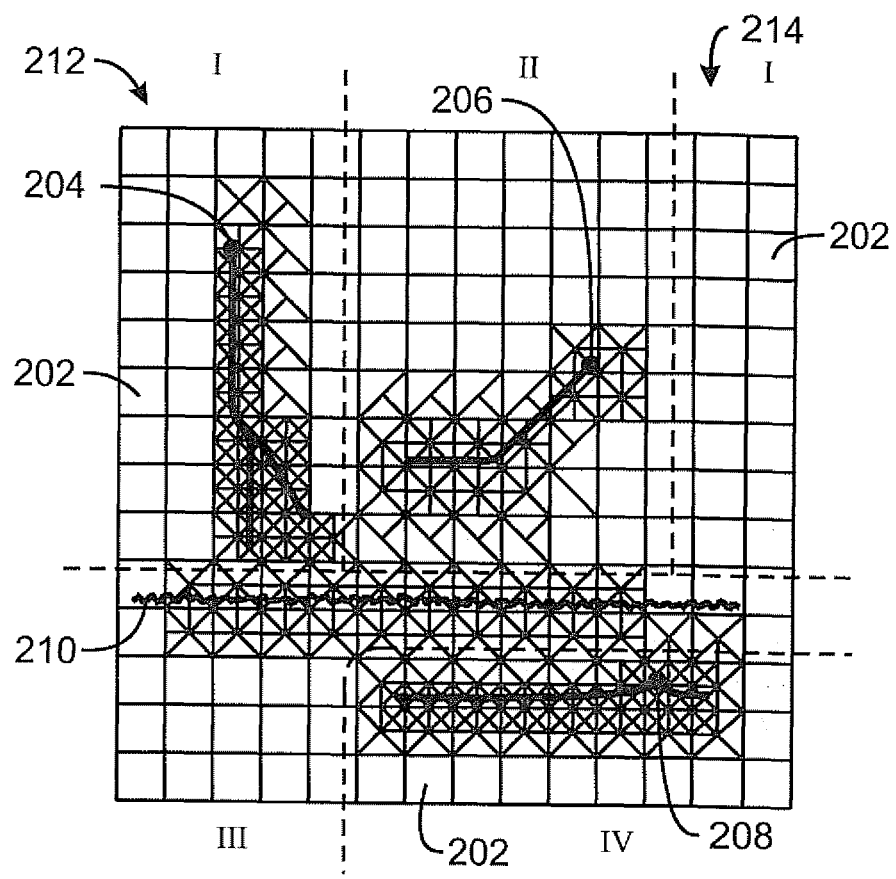
FIG. 2 is a top view of a reservoir showing a planar projection of a computational mesh over the reservoir, in accordance with an exemplary embodiment of the present techniques.

FIG. 2 is a top view of a reservoir showing a planar projection of a computational mesh 200 over the reservoir, in accordance with an exemplary embodiment of the present techniques. Although the computational mesh 200 is shown as a two dimensional grid of computational cells (or blocks) 202 to simplify the explanation of the problem, it should be understood that the actual computational mesh 200 can be a three dimension matrix of computational cells 202 that encompasses the reservoir.

A computational cell 202 is a single two or three dimensional location within a simulation model that represents a physical location in a reservoir. The computational cell 202 may have associated properties, such as a porosity or an oil content, which is assumed to be a single value over the entire computational cell 202 and is assigned to the center of the computational cell 202.

The computational cells 202 may interact with adjacent computational cells 202, for example, by having flux properties assigned to a shared border with the adjacent computational cells 202. For example, the flux properties may include heat transfer, mass transfer, or flow values, for example.

The stabilizing procedure discussed here is very general. This method does not make any restrictive assumption regarding compressibility, gravity, capillary pressure, or wells, and is applicable to solving black oil or compositional reservoir simulation problems. Exemplary embodiments of the techniques described herein do not require additional linear solve or property calculations. Accordingly, the computational cost is low.

In an exemplary embodiment of the present techniques, the cost of performing the stabilizing procedure for compositional models may scale only linearly with the number of components. As such, this method is especially well-suited for large complex models, or compositional models with a large number of components.

Besides these attractive mathematical properties, the method is relatively straightforward to implement. Test results show the technique significantly improves the stability of simulation runs. Though a few cases show a slight increase in computational costs, majority of tests also show a reduction in the simulation run time when the method is used.

Though the idea can be applied with different discretization methods, below we assume finite volume discretization with two-point flow approximation for the purpose of presentation.

Governing Equations

The basic equation governing flow in a reservoir is Darcy's law:

$$u = -\frac{K}{\mu}\nabla p, \qquad \text{EQUATION 1}$$

where u is fluid velocity, K is permeability, $\mu$ is fluid viscosity, and $\nabla p$ is the pressure gradient. For multiphase flow, Darcy's law takes the form:

$$F_v = T\lambda_v(S)[\Delta p - g\rho_v \Delta h + \Delta p_{c,v}(S)], \qquad \text{EQUATION 2}$$

where $F_v$, T, $\lambda(S)$, $\rho_v$, $\Delta p$, $\Delta h$, and $\Delta p_{c,v}$ are phase flow rate, transmissibility, phase mobility (relative permeability divided by viscosity), phase density, pressure difference (between neighboring cells), depth difference, and capillary pressure difference, respectively.

Component mass flow rates U for component i can be expressed in terms of $F_v$:

$$U_i = \sum_{v=1}^{\omega} \xi_{i,v} F_v, \qquad \text{EQUATION 3}$$

where $\xi_{v,i}$ where is density of component i in phase v (referred to as phase component density for short), and $\omega$ is the total number of phases. To enhance stability in the simulation, phase mobility and phase component density (referenced in Equations (2) and (3)) may be taken from the upstream side.

For black-oil models, gas, oil and water are the possible components. The components appear in gas phase, oil phase, and water phase, respectively. Optionally, gas can also be allowed to dissolve in oil and water phases. Similarly, oil may vaporize into a gas phase. If oil is saturated, $\xi_{i,v}$ are functions of pressure only. More precisely:

$$\begin{cases} \xi_{g,o} = \dfrac{R_{so}(p)}{B_o(p)} \\ \xi_{o,o} = \dfrac{1}{B_o(p)}, \end{cases} \qquad \text{EQUATION 4}$$

where $B_o$ is oil formation volume factor, and $R_{so}$ is solubility of gas in oil phase. If oil is undersaturated:

$$\begin{cases} \xi_{g,o} = \dfrac{R_{so}(p_{sat})}{\overline{B}_o} \\ \xi_{o,o} = \dfrac{1}{\overline{B}_o}, \end{cases} \qquad \text{EQUATION 5}$$

where $P_{sat}$ is saturation pressure, which is a function of component masses $n_1, n_2, \ldots n_m$. Undersaturated formation volume factor $\overline{B}_0$ can be expressed as:

$$\overline{B}_o(p, p_{sat}) = \qquad \text{EQUATION 6}$$
$$\begin{cases} \dfrac{B_o(p_{sat})}{1 + C_{Bo}(p - p_{sat})}, & \text{if gas is allowed in oil} \\ B_o(p), & \text{if gas is not allowed in oil.} \end{cases}$$

As understood by one skilled in the art, saturation may include different types of saturation. The different types of saturation may include gas, oil, or water. For both pressure and saturation variables, their values are generally different between different parts of the reservoir.

Phase component density can be computed similarly for gas or water phase. For compositional models, the presence of individual phases, as well as values of phase mole fraction and component density are determined based on phase equilibrium. In general, $\xi_{v,i}$ in that case depends on both p and $n_i$ whether the fluid is saturated or not.

The physical conditions that flow must satisfy are volume balance $$v_t(p, n_1, n_2, \ldots, n_m) = v_p(p), \qquad \text{EQUATION 7}$$

which states that fluids must fill up entire available pore volume, and mass conservation:

$$\delta n_i = dt \sum_l U_{i,l}, \qquad \text{EQUATION 8}$$

where dt is time step size and the summation on the right hand side is over all faces on the boundary of the control volume.

Typically, the Newton-Raphson method can be used to solve the equations governing multiphase flow. Existing formulation methods used for Newton-Raphson differ mostly in how expressions for component mass flow rates are linearized. For example, with the CI method, U is linearized fully for all variables involved.

For IMPES, SI, and IMPSAT, linearization is carried out for pressure or pressure and saturations only. The common deficiency in these three different methods is the explicit treatment of phase component density, $\xi_{v,i}$. As stated previously, $\xi_{v,i}$ is dependent on pressure, and changes with $n_1$, $n_2$, ... $n_m$ with exception to saturated fluids and when a black-oil model is used.

Figure 3:
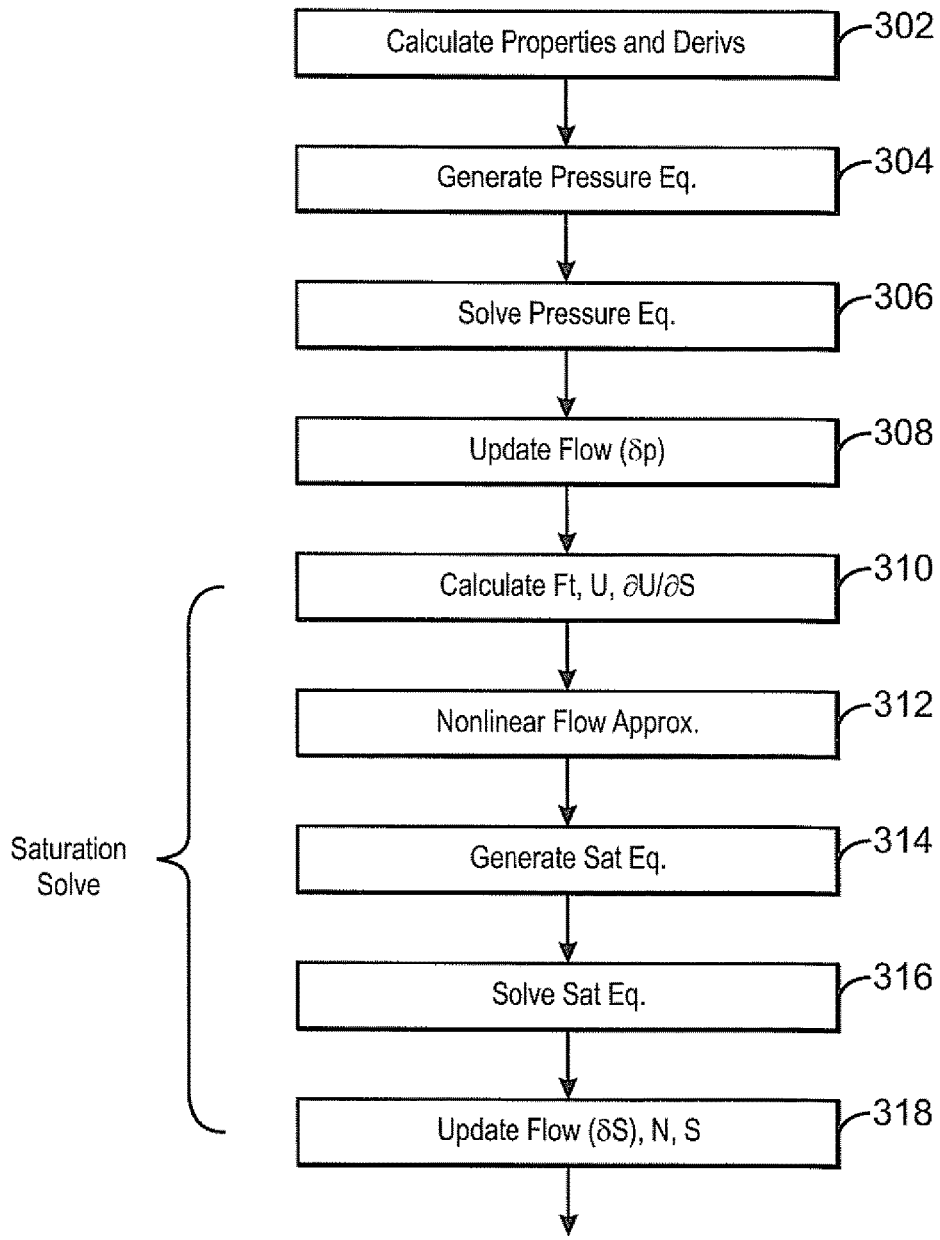
FIG. 3 is a process flow diagram of a method for predicting multiphase flow, in accordance with an exemplary embodiment of the present techniques.

FIG. 3 is a process flow diagram of a method 300 for predicting multiphase flow, in accordance with an exemplary embodiment of the present techniques. The method 300 may vary, depending on the formulation method used.

For SI the method 300 may begin at block 302, where properties and time derivatives may be calculated. At block 304, a pressure equation may be generated. For the SI formulation method, there are two separate steps for pressure and saturation solves. With the pressure solve, p is the only unknown variable, while saturation and masses are treated explicitly.

The following linearized equation for mass flow rates:

$$U_i = U_i^0 + \frac{\partial U_i}{\partial p}\delta p, \qquad \text{EQUATION 9}$$

may be substituted into the linearized volume balance, accounting for the rock compressibility effect, $$v_t^0 + \frac{\partial v_t}{\partial p}\delta p + \sum_i \frac{\partial v_t}{\partial n_i}\delta n_i = v_p^0 + \frac{\partial v_p}{\partial p}\delta p. \qquad \text{EQUATION 10}$$

Accordingly, the following pressure equation may be generated:

$$\left[\frac{\partial v_t}{\partial p} + dt\sum_{i=1}^{m}\left(\frac{\partial v_t}{\partial n_i} \cdot \frac{\partial U_i}{\partial p}\right) - \frac{\partial v_p}{\partial p}\right]\delta p = \qquad \text{EQUATION 11}$$

$$v_p^0 - v_t^0 - \sum_{i=1}^{m}\frac{\partial v_t}{\partial n_i}dt \cdot U_i^0,$$

where superscript$^0$ indicates using the beginning of the time step value for the variables, and $\delta p = p - p^0$.

With SI, pressure solve is typically performed once per time step. As a result, the total volume balance equation, Equation 7, may hold only in an approximate sense at the end of the time step. To control the volume balance errors, maximum volume discrepancy, pressure change, and saturation changes are usually included as time step control parameters for the simulation. At the same time, a dt-dependent relaxation factor r may be inserted into Equation 11, resulting in the following pressure equation:

$$\left[\frac{\partial v_t}{\partial p} + dt\sum_{i=1}^{m}\left(\frac{\partial v_t}{\partial n_i} \cdot \frac{\partial U_i}{\partial p}\right) - \frac{\partial v_p}{\partial p}\right]\delta p = \qquad \text{EQUATION 12}$$

$$r(v_p^0 - v_t^0) - \sum_{i=1}^{m}\frac{\partial v_t}{\partial n_i}dt \cdot U_i^0,$$

which may help ensure that changes in p and $S_v$ become small when a small time step size is used. A small time step size may be used in the event that a time step cut is necessary. At block 306, the pressure equation may be solved.

For the IMPES formulation method, pressure is the only unknown variable, while saturation and masses may be treated explicitly. As such, the IMPES pressure equation is the same as the pressure equation derived above for the SI formulation method. After pressure is solved, flow rates for IMPES are calculated as specified in EQUATION 9. Flow rates are then substituted into EQUATION 8 to obtain updated masses, i.e., $n_1$, $n_2$, . . . , $n_m$.

At block 308, the potential difference and phase flow rates for SI may be updated:

$$F_v = F_v^0 + \frac{\partial F_v}{\partial p}\delta p \qquad \text{EQUATION 13}$$

At block 310, phase flow rate, $F_v$, mass flow rates, U, and derivatives of U may be calculated. Upstream direction of flow may be reset at this point to be consistent with the updated $F_v$. Flow fractions and total flow rate may then be defined as $f_v = \lambda_v(s)/\Sigma\lambda_v(s)$ and $F_t = \Sigma F_v$. Using $F_t$, phase flow rates may be recalculated as functions of saturations:

$$\overline{F}_v = \frac{\lambda_v(S)}{\lambda_t(S)}\left\{F_t + T \cdot g\delta h\left[\sum_{v'}\lambda_{v'}(S)(\rho_v - \rho_{v'})\right] - \qquad \text{EQUATION 14}\right.$$

$$\left.T \cdot \left[\sum_{v'}\lambda_{v'}(S)(\delta p_{c,v}(S) - \delta p_{c,v'}(S))\right]\right\}$$

Mass flow rates may then be computed accordingly:

$$\overline{U}_i = \sum_{v=1}^{\omega}\xi_{i,v}\overline{F}_v, \qquad \text{EQUATION 15}$$

and similarly for derivatives $$\frac{\partial \overline{U}_i}{\partial S_v} = \sum_{v'=1}^{\omega}\xi_{i,v'}\frac{\partial \overline{F}_{v'}}{\partial S_v}. \qquad \text{EQUATION 16}$$

At block 312, a nonlinear flow approximation may be performed. In an exemplary embodiment of the present techniques, the values of at $\Sigma_{v,i}$ at $t^{k+1/2}$ may be computed, and then substituted into Equation 3. While (conceptually) $\Sigma_{v,i}$ at $t^{k+1/2}$ is determined ultimately from states of flow at $t^k$, the computational procedure has been expanded in scope here compared to the high-order finite difference treatment for hyperbolic equations. Instead of deriving an analytical expression to approximate mid-time level fluxes using solutions at $t^k$ from the neighboring cells, $\xi_{v,i}$ may be estimated at $t^{k+1/2}$ by evolving an auxiliary time-dependent system which can be considered a nonlinear approximation of the original multiphase flow problem. It should be noted that mid-time is only used here as an example. In exemplary embodiments of the techniques presented, other time levels could be used that are between an old time level and a new time level of the time step.

In the nonlinear flow approximation, the $\xi_{v,i}$ term is updated linearly for mass changes, while saturation changes may be computed as differences between ratios of phase volumes and total fluid volumes before and after the update. Phase flow rates $F_v$ may also be updated linearly from saturation changes.

For IMPES and SI, the update of $F_v$ may be carried out while constraining total velocity to be constant. Additionally, the sum of products of the updated $\xi_{v,i}$ and $F_v$ may be set to be the updated component flow rates $U_i$. In contrast to a typical simulation, updates of $\xi_{v,i}$, $F_v$, $S_v$, and $U_i$ may be based on derivatives calculated at the beginning of the time step. As such, the auxiliary time-stepping procedure does not involve black-oil, eos property calculations, or linear solves.

The auxiliary time-stepping is fast because it sidesteps property calculations and solve, which are two major categories of computational cost for regular simulations. The procedure explained below has a common theme for IMPES, SI, and IMPSAT, though the exact steps vary slightly depending on the formulation method.

For the SI formulation method, the nonlinear flow approximation may be performed after the pressure solve. Phase flow rates and mass flow rates may then be recomputed from the total phase rate.

Nonlinear flow approximation is described in greater detail with reference to FIG. 4.

At block 314, phase component density from nonlinear flow approximation is used in EQUATIONS 15 and 16. The saturation equations may then be generated. For the SI formulation method, EQUATIONS 14 and 15 may ensure that total flux through any face remains the same even when phase saturations change during the saturation solve. As such, volume discrepancy errors may be minimized during the simulation. Volume discrepancy errors may be minimized because, assuming constant molar density in the reservoir, saturations may be consistent with fluid volumes for all phases in the linearized sense.

For this reason, $F_v$ and $U_i$ may also be used when constructing nonlinear flow approximations. To obtain equations for saturation solve, the following definition of phase saturation $$S_v v_p = v_v \qquad \text{EQUATION 17}$$

may be written for $\omega-1$ phases and linearized as $$\delta S_v v_p^0 - \sum_i \frac{\partial v_v}{\partial n_i} = v_v^0 - S_v^0 v_p^0 - S_v^0 \frac{\partial v_p}{\partial p}\delta p + \frac{\partial v_v}{\partial p}\delta p. \qquad \text{EQUATION 18}$$

Replacing $\delta n_i$ with $$dt \sum_i \overline{U}_{i,l}, \text{ where } \overline{U}_{i,l} \text{ is:}$$

$$\overline{U}_i = \overline{U}_i^0 + \sum_{v'} \frac{\partial \overline{U}_i}{\partial S_{v'}} \delta S_{v'}. \qquad \text{EQUATION 19}$$

The final form of saturation equations for the SI formulation method may then be represented as:

$$v_p^0 \delta S_v - dt \sum_{v',v''} \left[\sum_i \xi_{i,v'} \frac{\partial \overline{F}_{v'}}{\partial S_{v''}} \frac{\partial v_v}{\partial n_i}\right] \delta S_{v''} =$$

$$r(v_v^0 - S_v^0 v_p^0) - S_v^0 \frac{\partial v_p}{\partial p}\delta p + \frac{\partial v_v}{\partial p}\delta p + dt\left[\sum_i \overline{U}_i^0 \frac{\partial v_v}{\partial n_i}\right] \qquad \text{EQUATION 20}$$

Similar to the equations for the pressure solve, a relaxation factor may be included in the saturation equation. It should be noted that the $\delta p$ term on the right hand side of EQUATION 20 is known from the pressure solve.

Saturations changes for IMPES formulation may be computed without a solve, as:

$$\delta S_v = \frac{v_v^0 + \frac{\partial v_v}{\partial p}\delta p + \sum_i^m \frac{\partial v_v}{\partial n_i}\delta n_i}{v_p^0 + \frac{\partial v_p}{\partial p}\delta p} - S_v^0 \qquad \text{EQUATION 21}$$

At block 316, the saturation equations may be solved. At block 318, mass flow rates and masses may be updated based on Equations 19 and 8.

For the IMPES formulation method, nonlinear flow approximation may be added as a post-processing step after the pressure solve. In contrast to SI, flow approximation for IMPES may be considered an explicit solution procedure for saturations and masses. After the pressure solve, phase flow rates may be updated, and total flow rate may be computed.

Values of $\overline{F}_v$, $\partial \overline{F}_v/\partial S$, $\overline{U}_i$, and $\partial \overline{U}_i/\partial S$, as defined in Equations 14 and 15, may then be computed. The nonlinear flow approximation for IMPES is the same as that for SI, except the auxiliary time stepping will go from $t^k$ to $t^{k+1}$. For IMPES, the final values of mass flow rates ($U_i^{*,k+J}$) from auxiliary time-stepping are used to calculate the final mass changes $\delta n_i$ for the time step, which is then plugged into Equation 21 to compute saturation changes. Advantageously, the additional calculation steps improve accuracy of phase component densities as well as saturation solutions for IMPES method.

For the IMPSAT formulation method, non-linear flow approximation may be performed as a pre-processing step before the pressure solve. Non-linear flow approximation for IMPSAT is similar to that for SI except that the approximation of flow uses $F_v$, $\partial F_v/\partial S$, $U_i$, and $\partial U_i/\partial S$ evaluated at the beginning of time step rather than $\overline{F}_v$, $\partial \overline{F}_v/\partial S$, $\overline{U}_i$ and $\partial \overline{U}_i/\partial S$ computed from total flow rate. When non-linear flow approximation is completed, phase component density $\xi_{i,v}^{*,k+J}$ at $t^{k+1/2}$ is substituted into the expressions for mass flow rates (Equation 3) to recalculate $U_i$, $\partial U_i/\partial p$, and $\partial U_i/\partial S$ terms, necessary building blocks for IMPSAT equations for pressure solve and phase saturation solve. It should be noted that mid-time is only used here as an example. In exemplary embodiments of the techniques presented, other time levels could be used that are between an old time level and a new time level of the time step.

For the IMPSAT formulation method, pressure and phase saturations may be solved simultaneously. Equations used for the IMPSAT method may include total volume balance, i.e., EQUATION 7, and $\omega-1$ equations for phase saturations, i.e., EQUATION 17. EQUATIONS 7 and 17 may be linearized with respect to $\delta p$ and $\delta S_v$:

$$\left[\frac{\partial v_t}{\partial p} + dt \sum_{i=1}^{m}\left(\frac{\partial v_t}{\partial n_i}\cdot\frac{\partial U_i}{\partial p}\right) - \frac{\partial v_p}{\partial p}\right]\delta p + \qquad \text{EQUATION 22}$$

$$\sum_v\left[dt\sum_i\left(\frac{\partial U_i}{\partial S_v}\frac{\partial v_t}{\partial n_i}\right)\right]\delta S_v =$$

$$r(v_p^0 - v_t^0) - \sum_{i=1}^{m}\frac{\partial v_t}{\partial n_i}dt\cdot U_i^0 \text{ and}$$

$$\left[\frac{\partial v_v}{\partial p} + dt\sum_{i=1}^{m}\left(\frac{\partial v_v}{\partial n_i}\cdot\frac{\partial U_i}{\partial p}\right) - S_v\frac{\partial v_p}{\partial p}\right]\delta p + \qquad \text{EQUATION 23}$$

$$\sum_{v'}\left[dt\sum_i\left(\frac{\partial U_i}{\partial S_{v'}}\frac{\partial v_v}{\partial n_i}\right) - \delta_{v,v'}v_p\right]\delta S_{v'} =$$

$$r(S_v v_p^0 - v_v^0) - \sum_{i=1}^{m}\frac{\partial v_v}{\partial n_i}dt\cdot U_i^0$$

Figure 4:
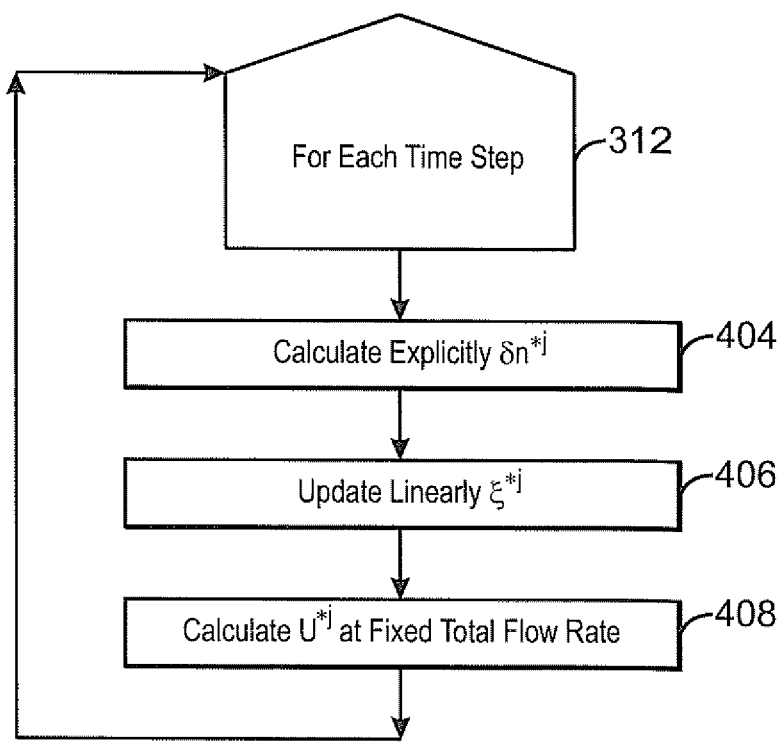
FIG. 4 is a process flow diagram of a method for nonlinear flow approximation, in accordance with an exemplary embodiment of the present techniques.

FIG. 4 is a block diagram of a method 312 for nonlinear flow approximation, in accordance with an exemplary embodiment of the current techniques. In the method 312, $\xi_{v,i}$ is treated more accurately than fixing its value at the beginning of the time step.

According to the Lax-Wendroff scheme for hyperbolic conservation laws, the accuracy of the finite difference scheme may be improved by centering fluxes at the mid-time level, $t^{k+1/2}$ rather than the beginning of the time step. The resulting scheme is still explicit because fluxes at $t^{k+1/2}$ are numerically related to their values at $t^k$, and to the time derivatives of the equation unknowns. By differentiating and manipulating the original hyperbolic equations, the time derivatives can be also expressed in terms of fluxes from neighboring cells at $t^k$.

The method 312 may be an auxiliary system for estimating $\xi_{v,i}$ at $t^{k+1/2}$ as an explicit scheme based on mass conservation equations. Blocks 404-408 may be repeated for each time step. At block 404, the masses may be explicitly calculated. Starting from the states of flow at $t^k$, the method 312 may first select an auxiliary time step size, $dt^* = (t^{k+1/2} - t^k)/J$, and explicitly calculate masses $n_i^{*,k+j}$ for time $t^k + j\cdot dt^*$, $1 \leq j \leq J$, using $$\delta n_i^{*,k+j} = dt^* \sum_l U_{i,l}^{*,k+j-1} \qquad \text{EQUATION 24}$$

At block 406, the phase component density may be updated. In each auxiliary time step $\xi_{v,i}$ is updated as:

$$\xi_{v,i}^{*,k+j} = \xi_{v,i}^0 + \sum_{i'}\frac{\partial \xi_{v,i}}{\partial n_{i'}}\left(n_{i'}^{*,k+j} - n_{i'}^0\right) \qquad \text{EQUATION 25}$$

At block 408, component flow rates may be calculated at the fixed total flow rate. First, saturations for flow approximation are calculated from ratios of phase volumes and total fluid volume as:

$$S_v^{*,k+j} = S_v^0 + \left[\frac{V_v^0 + \frac{\partial V_v}{\partial p}\delta p + \sum_i \frac{\partial V_v}{\partial n_i}\left(n_i^{*,k+j} - n_i^0\right)}{V_t^0 + \frac{\partial V_t}{\partial p}\delta p + \sum_i \frac{\partial V_t}{\partial n_i}\left(n_i^{*,k+j} - n_i^0\right)} - \frac{V_v^0}{V_t^0}\right] \qquad \text{EQUATION 26}$$

As stated previously, the value of $\delta p$ above is known from the pressure solve. Typically, a straightforward linear update is not recommended for saturations because it tends to make the auxiliary system highly nonlinear and may even cause solutions to blow-up. Phase flow rates and derivatives may be derived from total flow rate to update $F_v$:

$$F_v^{*,k+j} = \overline{F}_v(S^0) + \sum_{v'}\frac{\partial \overline{F}_v(S)}{\partial S_{v'}}\left(S_{v'}^{*,k+j} - S_{v'}^0\right) \qquad \text{EQUATION 27}$$

Mass flow rates at $t^k + j\cdot dt^*$ may then be computed as:

$$U_i^{*,k+j} = \sum_v\left[\xi_{i,v}^0 + \sum_{i'}\frac{\partial \xi_{i,v}}{\partial n_{i'}}\left(n_{i'}^{*,k+j} - n_{i'}^0\right)\right]\times \qquad \text{EQUATION 28}$$

$$\left[\overline{F}_v(S^0) + \sum_{v'}\frac{\partial \overline{F}_v(S)}{\partial S_{v'}}\left(S_{v'}^{*,k+j} - S_{v'}^0\right)\right]$$

As defined in EQUATION 28, $U_i^{*,k+J}$ depends nonlinearly on the changes between steps. The method 312 is completed when a specified number of steps have been performed. In an exemplary embodiment of the present techniques, 5-10 steps may be used. The $\xi_{v,i}$ terms in EQUATIONS 15, 16, AND 20 may then be replaced by $\xi_{i,v}^{*,k+J}$. The remaining calculation steps for SI formulation method may then be carried out without additional modification.

Figure 5:
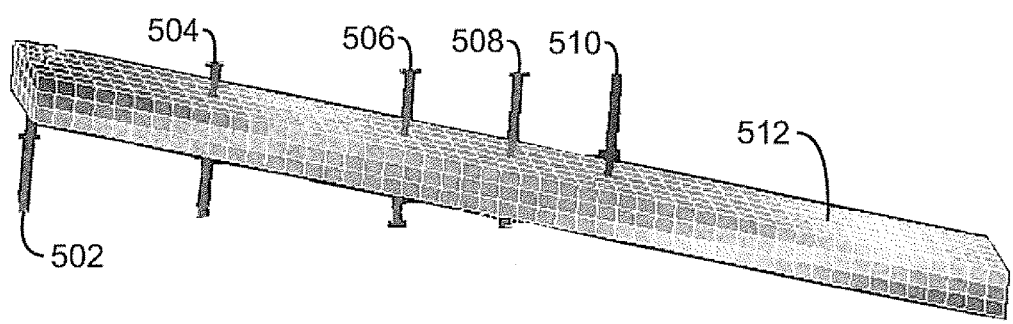
FIG. 5 is a block diagram of a black-oil model, in accordance with an exemplary embodiment of the current techniques.

FIG. 5 is a block diagram of a black-oil model 500, in accordance with an exemplary embodiment of the current techniques. The black oil model 500 includes a reservoir 512, two production wells, Produp 504 and Proddown 508, and injection wells 502, 506, and 510.

In the black-oil model, the reservoir 512 is partitioned into 3 layers and 750 grid blocks. The black-oil model 500 may be initialized based on capillary pressure-gravity equilibrium. At time 0, the reservoir 512 may be filled with gas in the upper part of reservoir. Below the gas, a transition zone may lie, in which gas saturation gradually decreases to 0 while oil saturation increases with depth.

At the lower part of the transition zone, oil saturation gradually decreases to 0 while water saturation increases with depth. In regions where gas saturation is zero, gas density in oil may initially be set to values corresponding to saturated condition.

The bottom-most part of the reservoir 512 may contain water only. In the black-oil model 500, there may be a water injector 510 at the bottom part of reservoir 512. Two gas injectors 502 and 506 in the black-oil model 500 are not activated.

The remaining wells includes one producer (Produp 504) at the upper part of the transition zone, and another producer (Proddown 508) at the lower part of the transition zone. A constant oil production rate of 5000 barrels (bbl)/day is imposed on the producers 504 and 508. The injector 510 may inject water at 80,000 bbl/day. To control the simulation run, maximum and target saturation change for all phases may be set to 5% and 4.5%.

Figure 6A:
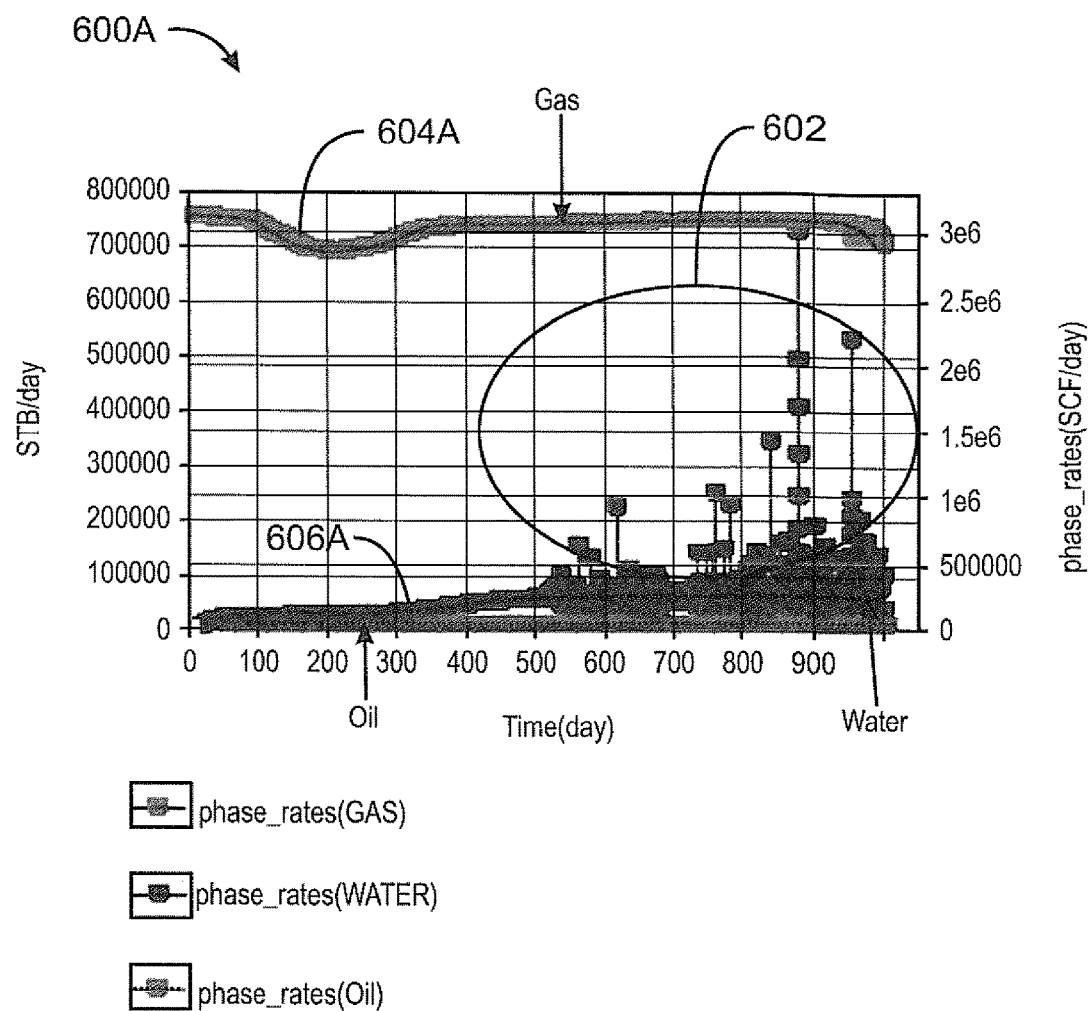
FIGS. 6A-6B are graphs illustrating a stabilization improvement for an IMPES formulation method, in accordance with an exemplary embodiment of the present techniques.
Figure 6B:
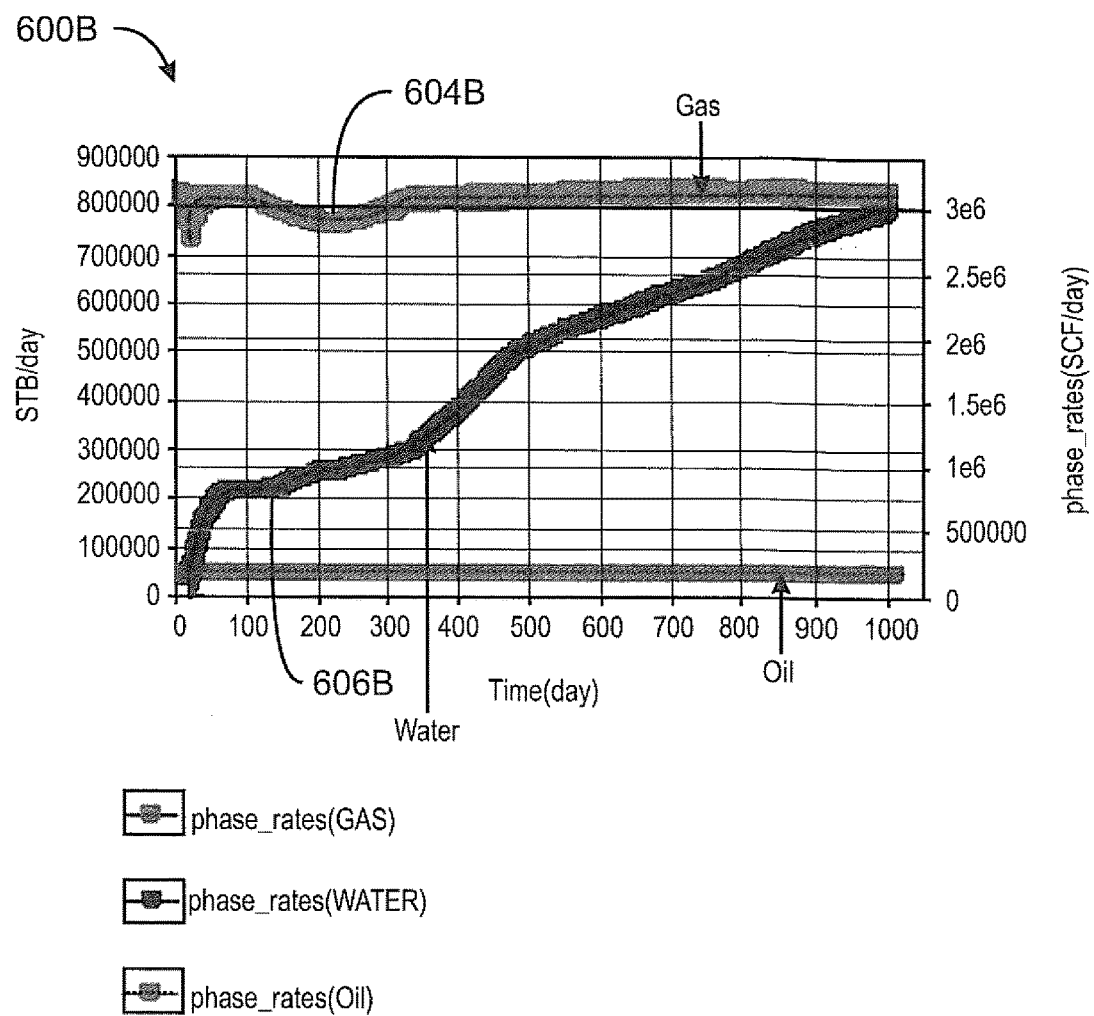

The same settings may be used for maximum and target volume discrepancy for all phases. FIGS. 6A-6B are graphs illustrating a stabilization improvement for an IMPES formulation method, in accordance with an exemplary embodiment of the present techniques. The graphs 600A and 600B represent results based on the black-oil model 500 using the standard IMPES method, and the stabilized IMPES method, respectively. For the sake of clarity, only simulation results for well Proddown 508 are shown.

As shown, the graphs 600A, 600B represent predicted phase rates for gas and water over a period of 900 days. The graph 600A, with data drawn from a standard IMPES method, shows substantial instability in the region 602. The region 602 represent phase rates for water between days 500 and 900. In contrast, the graph 600B, with data drawn from the stabilized IMPES method, shows a smooth curve for the water phase rates.

Figure 7A:
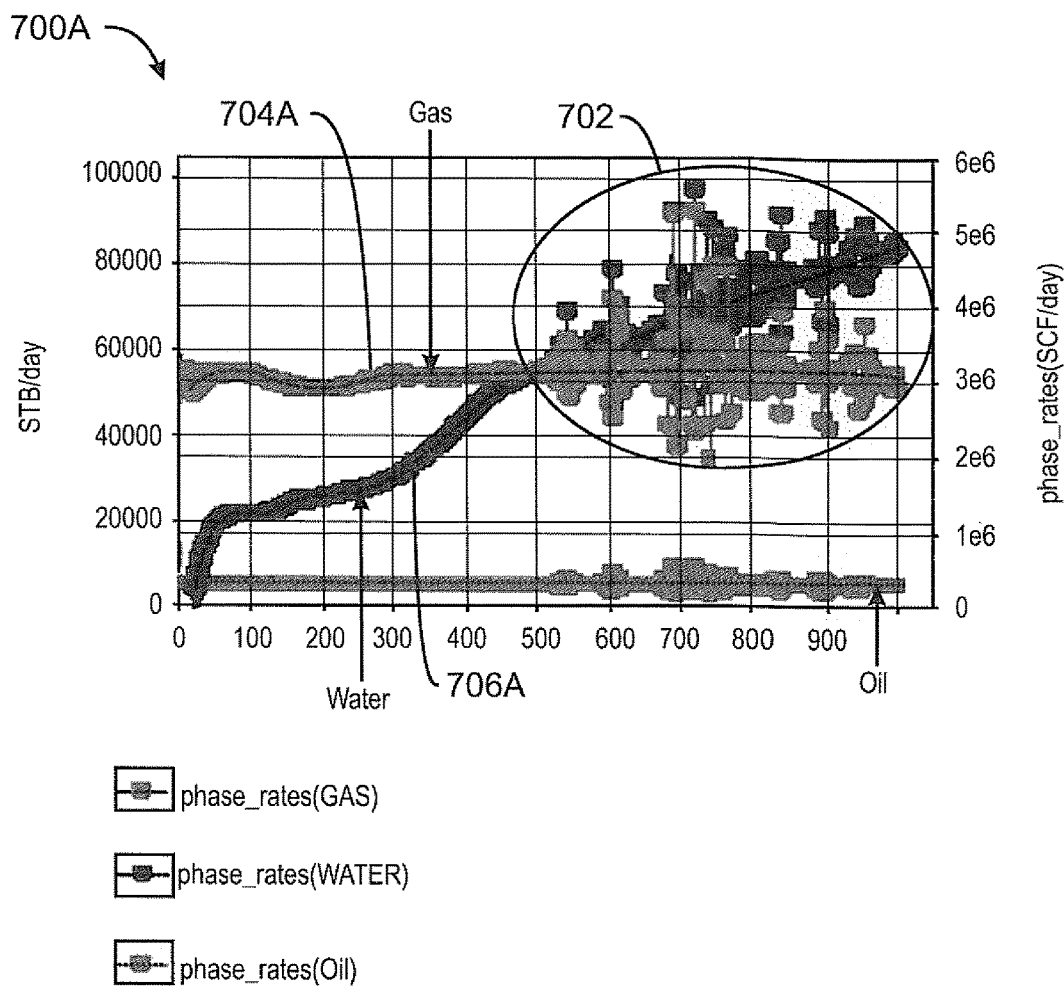
FIGS. 7A-7B are graphs illustrating a stabilization improvement for an SI formulation method, in accordance with an exemplary embodiment of the present techniques.
Figure 7B:
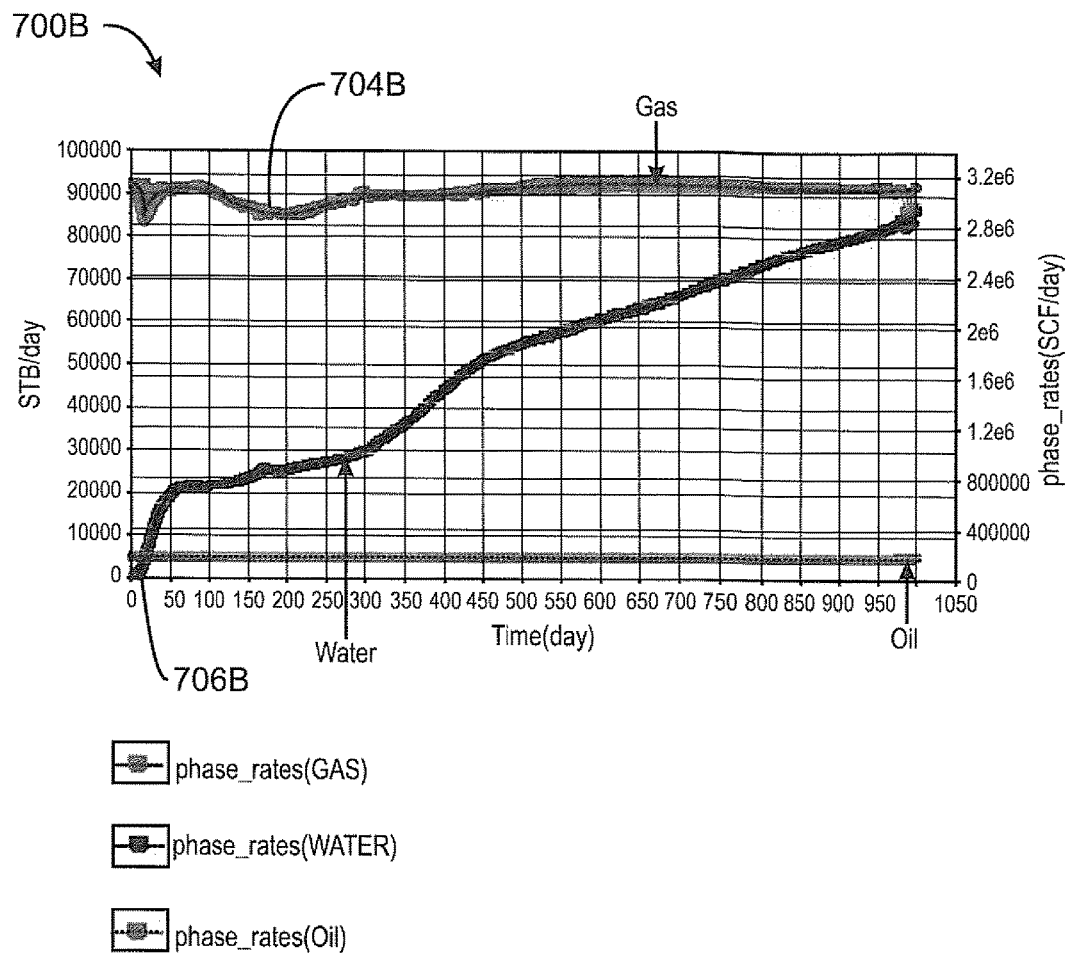

FIGS. 7A-7B are graphs illustrating a stabilization improvement for an SI formulation method, in accordance with an exemplary embodiment of the present techniques. As shown, graph 700A, which represents data derived from the standard SI method, includes a region 702 of great instability for phase rates for both gas and water. In contrast, the graph 700B, representing data derived from the stabilized SI method, includes smooth curves for the gas, water, and oil phase rates.

Figure 8A:
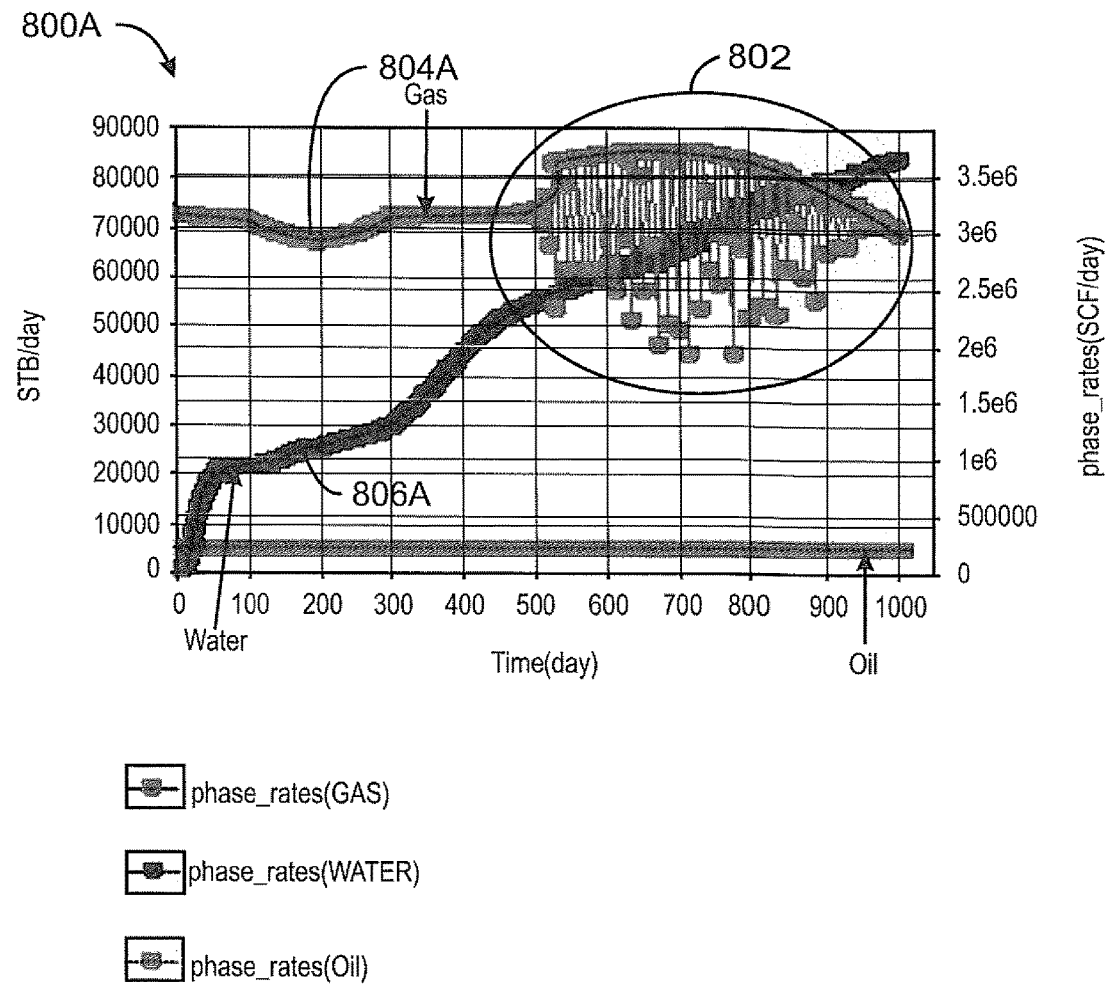
FIGS. 8A-8B are graphs illustrating a stabilization improvement for an IMPSAT formulation method, in accordance with an exemplary embodiment of the present techniques.
Figure 8B:
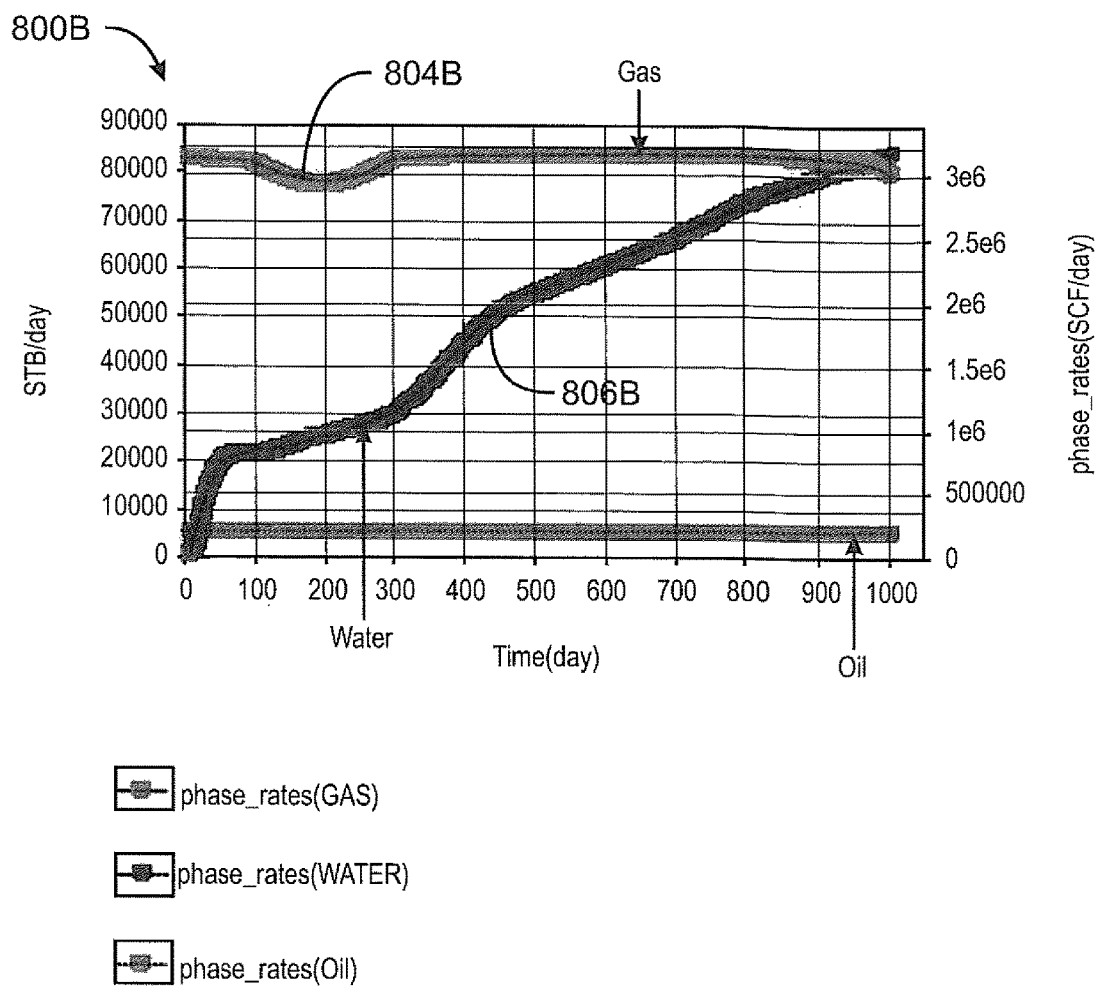

FIGS. 8A-8B are graphs illustrating a stabilization improvement for an IMPSAT formulation method, in accordance with an exemplary embodiment of the present techniques. As shown, graph 800A, which represents data derived from the standard IMPSAT method, includes a region 902 of great instability for phase rates for both gas and water. In contrast, the graph 800B, representing data derived from the stabilized IMPSAT method, includes smooth curves for the gas and water phase rates.

Figure 9:
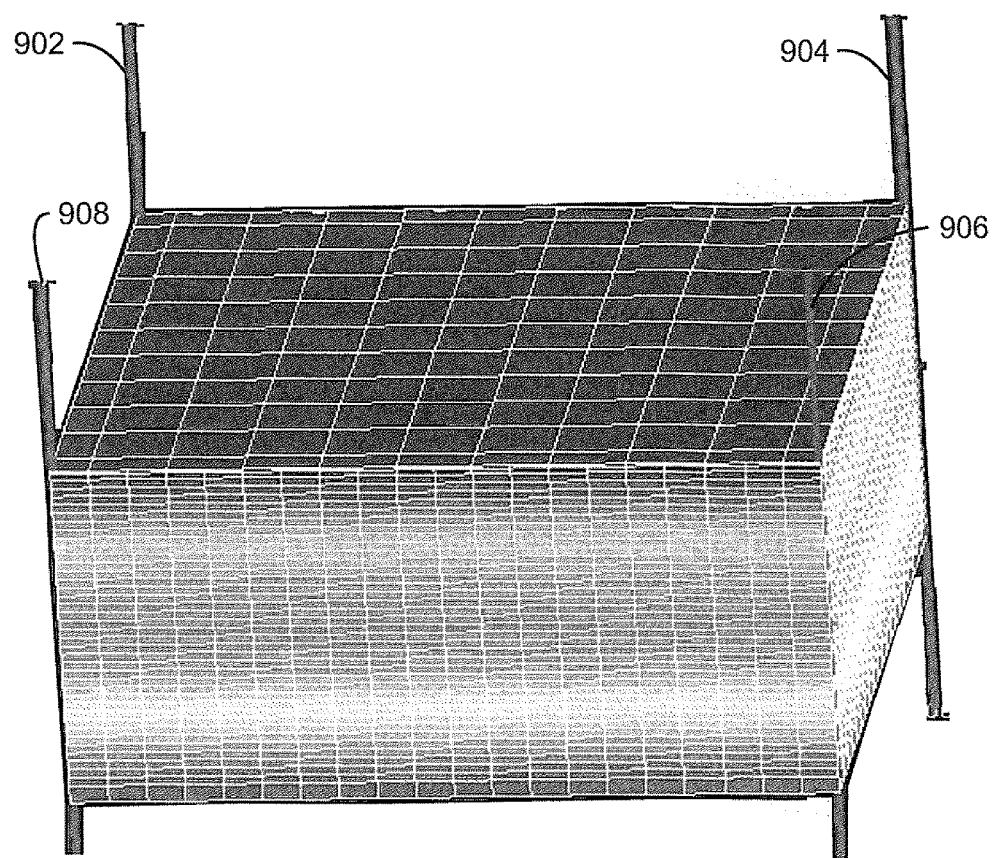
FIG. 9 is a block diagram of a compositional model, in accordance with an exemplary embodiment of the current techniques.

FIG. 9 is a block diagram of a compositional model 900, in accordance with an exemplary embodiment of the current techniques. The compositional model 900 includes a reservoir 910 with the shape of a cube, and is partitioned into 40 layers and 4840 grid blocks. In this example, the reservoir fluids contain 8 hydrocarbon components and water. The compositional model 900 is initialized based on capillary pressure-gravity equilibrium. At time 0, the reservoir 910 has water and under-saturated oil. In the compositional model 900, one active gas injector 908 and one active producer 904 are located at two opposite corners of the reservoir 910. The producer 904 is set to bhp control in well management which also enforces a maximum limit of 22.5 MSCF/day on gas production rate.

To control the simulation run, maximum and target saturation changes per time step for all phases may be set to 5% and 4.5%, while maximum and target volume discrepancy may be set to 5% and 4.5% for all phases. The same model is used for testing standard and stabilized versions of the SI formulation method.

Figure 10A:
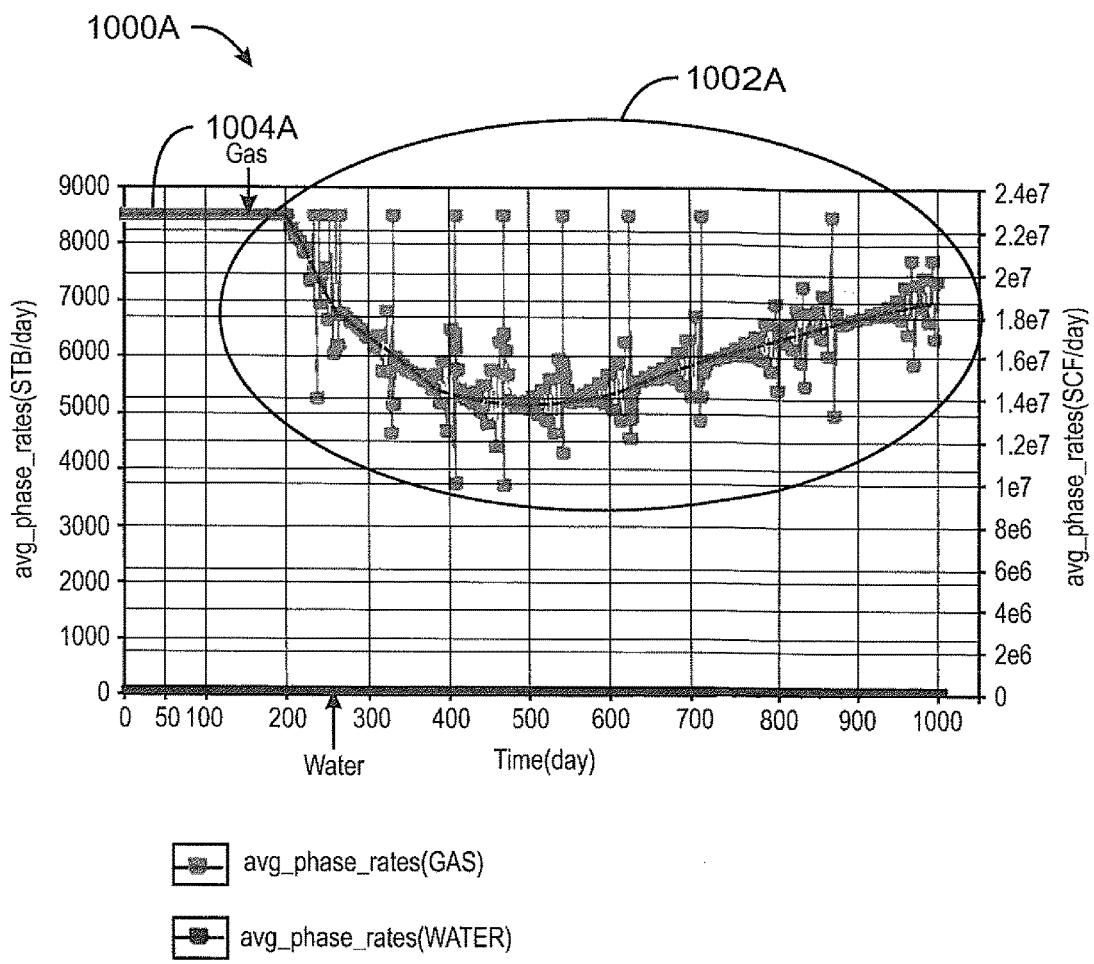
FIGS. 10A-10C are graphs illustrating a stabilization improvement for an SI formulation method on a compositional model, in accordance with an exemplary embodiment of the present techniques
Figure 10B:
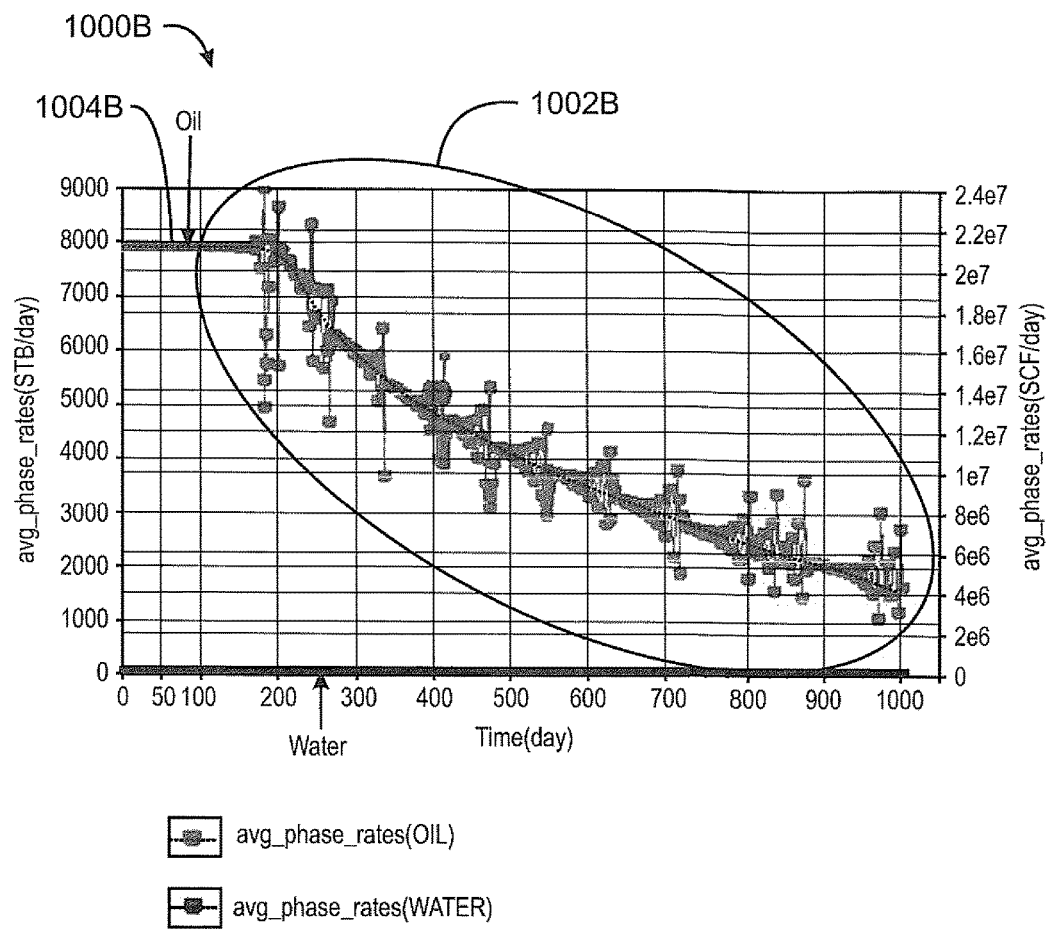
Figure 10C:
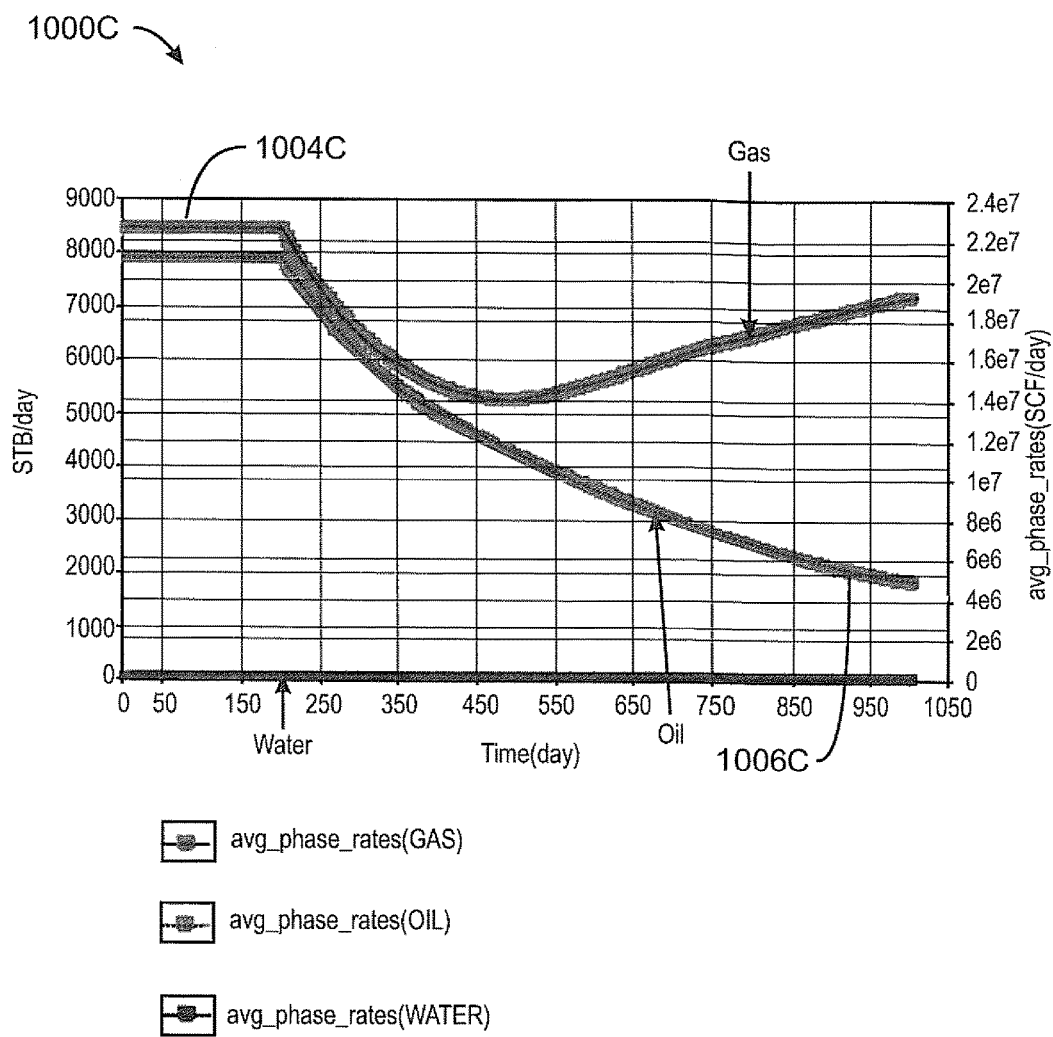

FIGS. 10A-10C are graphs illustrating a stabilization improvement for an SI formulation method on the compositional model 900, in accordance with an exemplary embodiment of the present techniques. The graphs 1000A and 1000B represent predicted phase rates for gas and oil using the standard SI formulation method. As shown, graphs 1000A and 1000B include regions 1004A and 1004B of stability and regions 1002A and 1002B of instability. In fact, there are so many numerical oscillations that well management control is triggered to limit the maximum gas production. In contrast, the graph 1000C (FIG. 10C), representing data derived from the stabilized method, includes two smooth curves 1004C and 1006C for the gas and oil phase rates.

Figure 11:
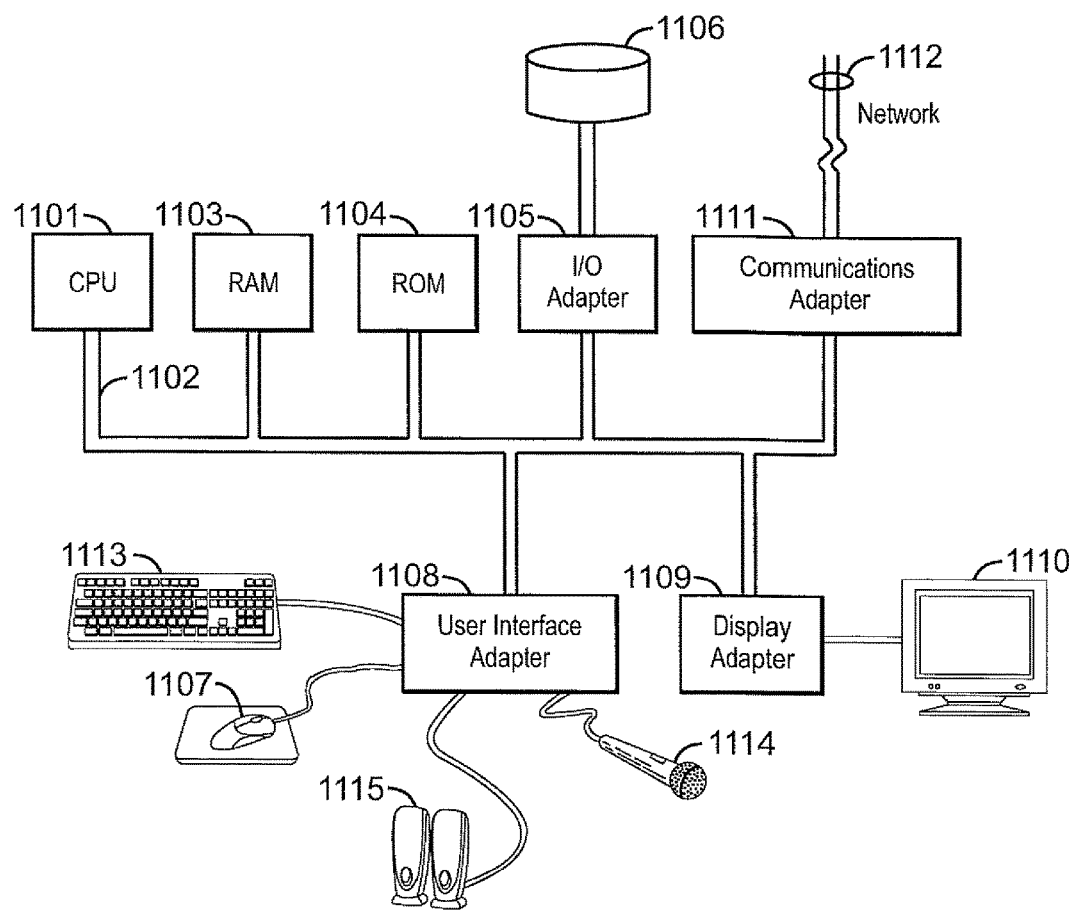
FIG. 11 is a block diagram of an exemplary cluster computing system that may be used in exemplary embodiments of the present techniques.

The techniques discussed herein may be implemented on a computing device, such as that illustrated in FIG. 11. FIG. 11 illustrates an exemplary computer system 1100 on which software for performing processing operations of embodiments of the present techniques may be implemented. A central processing unit (CPU) 1101 is coupled to a system bus 1102. In embodiments, the CPU 1101 may be any general-purpose CPU. The present techniques are not restricted by the architecture of CPU 1101 (or other components of exemplary system 1100) as long as the CPU 1101 (and other components of system 1100) supports operations according to the techniques described herein. The CPU 1101 may execute the various logical instructions according to embodiments. For example, the CPU 1101 may execute machine-level instructions for performing processing according to the exemplary operational flow described above in conjunction with FIGS. 3-4. As a specific example, the CPU 1101 may execute machine-level instructions for performing the methods of FIGS. 3-4.

The computer system 1100 may also include random access memory (RAM) 1103, which may be SRAM, DRAM, SDRAM, or the like. The computer system 1100 may include read-only memory (ROM) 1104 which may be PROM, EPROM, EEPROM, or the like. The RAM 1103 and the ROM 1104 hold user and system data and programs, as is well known in the art. The programs may include code stored on the RAM 1104 that may be used for modeling geologic properties, in accordance with embodiments of the present techniques.

The computer system 1100 may also include an input/output (I/O) adapter 1105, a communications adapter 1111, a user interface adapter 1108, and a display adapter 1109. The I/O adapter 1105, user interface adapter 1108, and/or communications adapter 1111 may, in certain embodiments, enable a user to interact with computer system 1100 in order to input information.

The I/O adapter 1105 may connect the bus 1102 to storage device(s) 1106, such as one or more of hard drive, compact disc (CD) drive, floppy disk drive, tape drive, flash drives, USB connected storage, etc. to computer system 1100. The storage devices may be utilized when RAM 1103 is insufficient for the memory requirements associated with storing data for operations of embodiments of the present techniques. For example, the storage device 1106 of computer system 1100 may be used for storing such information as computational meshes, intermediate results and combined data sets, and/or other data used or generated in accordance with embodiments of the present techniques.

The communications adapter 1111 is adapted to couple the computer system 1100 to a network 1112, which may enable information to be input to and/or output from the system 1100 via the network 1112, for example, the Internet or other wide-area network, a local-area network, a public or private switched telephony network, a wireless network, or any combination of the foregoing. The user interface adapter 1108 couples user input devices, such as a keyboard 1113, a pointing device 1107, and a microphone 1114 and/or output devices, such as speaker(s) 1115 to computer system 1100. The display adapter 1109 is driven by the CPU 1101 to control the display on the display device 1110, for example, to display information pertaining to a target area under analysis, such as displaying a generated representation of the computational mesh, the reservoir, or the target area, according to certain embodiments.

It shall be appreciated that the present techniques are not limited to the architecture of the computer system 1100 illustrated in FIG. 11. For example, any suitable processor-based device may be utilized for implementing all or a portion of embodiments of the present techniques, including without limitation personal computers, laptop computers, computer workstations, and multi-processor servers. For example, the present techniques and methodologies may be executed on a system having multiple parallel processors. Moreover, embodiments may be implemented on application specific integrated circuits (ASICs) or very large scale integrated (VLSI) circuits. In fact, persons of ordinary skill in the art may utilize any number of suitable structures capable of executing logical operations according to the embodiments.

While the present techniques may be susceptible to various modifications and alternative forms, the exemplary embodiments discussed above have been shown only by way of example. However, it should again be understood that the present techniques are not intended to be limited to the particular embodiments disclosed herein. Indeed, the present techniques include all alternatives, modifications, and equivalents falling within the true spirit and scope of the appended claims.

What is claimed is:

1. A method for producing hydrocarbons utilizing a computer system for modeling properties of a reservoir, comprising:
    providing the computer system comprising one or more processors and further comprising a machine readable medium comprising code configured to direct the processor to perform a simulation based on an IMPSAT formulation method for the reservoir that performs an auxiliary time-stepping procedure to improve the stability of the simulation, wherein the plurality of time steps comprise an old time step and a new time step; performing the simulation comprises:
        (i) calculating a plurality of phase flow rates at the old time and a plurality of phase flow rate derivatives with respect to a plurality of saturations at the old time;
        (ii) performing an auxiliary time-stepping procedure between the old time and the new time, wherein the auxiliary time-stepping procedure does not require additional linear solve or black-oil, equation of state property calculations, and wherein the auxiliary time-stepping procedure comprises:
            calculating a plurality of masses of the reservoir explicitly;
            updating a plurality of phase component densities of the reservoir linearly from the plurality of masses;
            calculating a plurality of saturation changes of the reservoir based on the plurality of masses;
            updating a plurality of phase flow rates of the reservoir based on the plurality of saturation changes, the plurality of phase flow rates at the old time, and the plurality of phase flow rate derivatives with respect to the plurality of saturations at the old time, and
            calculating a plurality of component flow rates of the reservoir based on the updated plurality of phase component densities, the plurality of phase flow rates of the reservoir;
        (iii) performing pressure and saturation linear solve after the performance of the auxiliary time-stepping procedure and between the old time and the new time;
        outputting a solution from the computer system; and
        producing hydrocarbons from the oil and/or gas field based on the solution that is outputted from the computer.

2. The method of claim 1, wherein performing the IMPSAT formulation method for the reservoir comprises:
    re-calculating, after the auxiliary time-stepping procedure, the plurality of component flow rates based on the plurality of phase component densities at a time level between the old time and the new time and phase flow rates at the old time;
    calculating a plurality of component flow rates derivatives with respect to a pressure and the plurality of saturations;
    solving, simultaneously and implicitly, the pressure of the reservoir and the plurality of saturations of the reservoir;
    updating the plurality of component flow rates of the reservoir based on the solved pressure and the plurality of saturation changes;
    updating for a simulation time-step the plurality of masses; and
    updating for the simulation time-step the plurality of saturations.

3. The method of claim 2, wherein one or more unknown variables of the IMPSAT formulation method are approximated at the time level.

4. The method of claim 1, wherein the IMPSAT formulation method is based on one of: a black-oil model; and a compositional model.

5. The method of claim 1, wherein the time level is a mid-time level or the new time level or a level between old and new time.

6. The method of claim 1, comprising performing a discretization method that is associated with the IMPSAT formulation method.

7. The method of claim 6, wherein the discretization method comprises one of:
    finite difference; finite volume; finite element; mixed finite element; discontinuous Galerkin, and mimetic finite difference.

8. A system for producing hydrocarbons from a reservoir, comprising:
    a plurality of processors;
    a machine readable medium comprising code configured to direct at least one of the plurality of processors to perform a simulation that is based on a sequential implicit (SI) formulation method for the reservoir that performs an auxiliary time-stepping procedure to improve the stability of the simulation, wherein the simulation comprises a plurality of time-steps and wherein the plurality of time-steps comprise an old time step and a new time step, the code is configured to:
        find a plurality of pressure solutions of a plurality of discretized pressure equations for the reservoir based on the sequential implicit (SI) formulation method;
        update a plurality of phase flow rates for the reservoir based on the plurality of pressure solutions;

calculate a plurality of phase flow rate derivatives for the reservoir with respect to a plurality of saturations for the reservoir;
perform an auxiliary time-stepping procedure between the old time and the new time, wherein a total phase flow rate is preserved, wherein the auxiliary time-stepping procedure does not require additional linear solve or black-oil, equation of state property calculations, and wherein the auxiliary time-stepping procedure comprises code configured to:
calculate a plurality of masses of the reservoir explicitly;
update a plurality of phase component densities of the reservoir in phase linearly from the plurality of masses:
calculate a plurality of saturation changes of the reservoir based on the plurality of masses;
update the plurality of phase flow rates for the reservoir based on the plurality of saturation changes; and
re-calculate a plurality of component flow rates of the reservoir based on the updated plurality of phase component densities and the plurality of phase flow rates;
perform saturation linear solve after the performance of the auxiliary time-stepping procedure and between the old time and the new time;
output simulation results from the simulation based on the SI formulation method for the reservoir that performs an auxiliary time-stepping procedure; and
a well management control system that is triggered to make adjustments in the producing of hydrocarbons from the reservoir based on the output simulation results.

9. The system of claim 8, wherein performing the SI formulation method comprises:
re-calculating, after the auxiliary time-stepping procedure, the updated plurality of component flow rates for the reservoir based on the plurality of phase component densities of the reservoir at a time level between the old time and the new time and the updated plurality of phase flow rates after finding the pressure solutions;
re-calculating a plurality of component flow rate derivatives for the reservoir with respect to the plurality of saturations based on the plurality of phase component densities at a time level between the old time and the new time and the plurality of phase flow rate derivatives with respect to the plurality of saturations after finding the pressure solutions;
solving the plurality of saturation changes of the reservoir implicitly;
updating the plurality of component flow rates based on the solved plurality of saturation changes;
updating for a simulation time-step the plurality of masses based on the updated plurality of component flow rates; and
updating for the simulation time-step the plurality of saturations.

10. The system of claim 9, wherein the time level is a mid-time level or new time level.

11. The system of claim 8, wherein the SI formulation method is based on one of: a black-oil model; and a compositional model.

12. The system of claim 8, wherein one or more unknown variables of the SI formulation method are approximated at the time level.

13. The system of claim 8, comprising performing a discretization method that is associated with the formulation method.

14. The system of claim 13, wherein the discretization method comprises one of: finite difference; finite volume; finite element; mixed finite element; discontinuous Galerkin, and mimetic finite difference.

15. A method for producing hydrocarbons from an oil and/or gas field using a stabilized formulation method relating to a physical structure, the method for producing hydrocarbons comprising:
providing a computer system comprising one or more processors and further comprising a machine readable medium comprising code configured to direct the processor to perform a simulation based on an IMPES formulation method for the oil and/or gas field that performs an auxiliary time-stepping procedure to improve the stability of the simulation, wherein the plurality of time steps comprise an old time step and a new time step;
performing the simulation comprises:
in the computer system, solving a pressure equation for the oil and/or gas field based on the IMPES formulation method to obtain pressure solutions;
in the computer system, updating a plurality of phase flow rates for the oil and/or gas field based on the solved pressure solutions;
in the computer system, calculating a plurality of phase flow rate derivatives for the oil and/or gas field with respect to a plurality of saturations for the reservoir;
in the computer system, performing an auxiliary time-stepping procedure between the old time and the new time of each of the plurality of time steps, wherein the auxiliary time-stepping procedure does not require additional linear solve or black-oil, equation of state property calculations, and wherein a total phase flow rate is preserved, wherein the auxiliary time-stepping procedure comprises:
calculating a plurality of masses for the oil and/or gas field explicitly;
updating a plurality of phase component densities for the oil and/or gas field linearly from the plurality of masses;
calculating a plurality of saturation changes for the oil and/or gas field based on the plurality of masses;
updating the plurality of phase flow rates for the oil and/or gas field based on the plurality of saturation changes; and
calculating a plurality of component flow rates for the oil and/or gas field based on the updated plurality of phase component densities and the plurality of phase flow rates;
outputting simulation results from the simulation based on the IMPES formulation method for the oil and/or gas field that performs an auxiliary time-stepping procedure; and
producing hydrocarbons from the oil and/or gas field based at least in part on results of the simulation performed based on the IMPES formulation method for the oil and/or gas field that performs an auxiliary time-stepping procedure.

16. The method of claim 15, comprising:
updating for a simulation time-step the plurality of masses based on the plurality of component flow rates;
updating for the simulation time-step the plurality of saturations based on the plurality of masses; and extracting hydrocarbons from the oil and/or gas field based on the updated plurality of masses, the updated plurality of saturations, and the plurality of component flow rates.

17. The method of claim 16, wherein one or more unknown variables of the IMPES formulation method are approximated at the time level.

18. The method of claim 17, wherein the time level is the new time level.

19. The method of claim 15, wherein the IMPES formulation method is based on one of: a black-oil model; and a compositional model.

20. The method of claim 15, comprising performing a discretization method that is associated with the formulation method, wherein the discretization method comprises one of: finite difference; finite volume; finite element; mixed finite element; discontinuous Galerkin, and mimetic finite difference.

\* \* \* \* \*